United States Patent
Nakamura et al.

(10) Patent No.: US 7,800,386 B2
(45) Date of Patent: Sep. 21, 2010

(54) CONTACT DEVICE AND METHOD FOR PRODUCING THE SAME

(75) Inventors: Kiyoto Nakamura, Tokyo (JP); Hiroshi Arikawa, Tokyo (JP); Yoshiaki Moro, Tokyo (JP); Hirokazu Sampei, Tokyo (JP)

(73) Assignee: Advantest Corporation, Tokyo (JP)

( * ) Notice: Subject to any disclaimer, the term of this patent is extended or adjusted under 35 U.S.C. 154(b) by 174 days.

(21) Appl. No.: 12/174,645

(22) Filed: Jul. 17, 2008

(65) Prior Publication Data
US 2009/0184728 A1 Jul. 23, 2009

Related U.S. Application Data

(63) Continuation of application No. PCT/JP2007/050838, filed on Jan. 19, 2007.

(30) Foreign Application Priority Data

Jan. 19, 2006 (JP) .............................. 2006-011028
Jul. 31, 2006 (JP) .............................. 2006-208841

(51) Int. Cl.
*G01R 31/02* (2006.01)
*G01R 31/28* (2006.01)

(52) U.S. Cl. .................. 324/757; 324/761; 324/754
(58) Field of Classification Search .............. 324/158.1, 324/252, 754–758, 761–765, 537; 257/295; 438/14, 48
See application file for complete search history.

(56) References Cited

U.S. PATENT DOCUMENTS 6,714,030 B2* 3/2004 Kohno et al. ................ 324/754
6,828,810 B2* 12/2004 Kanamaru et al. .......... 324/754

FOREIGN PATENT DOCUMENTS

| JP | 61-288384 | 12/1986 |
| JP | 01-194218 | 8/1989 |
| JP | 04-282515 | 10/1992 |
| JP | 2003-281988 | 10/2003 |
| JP | 2003-322663 | 11/2003 |
| JP | 2004-055410 | 2/2004 |

* cited by examiner

*Primary Examiner*—Minh N Tang
*Assistant Examiner*—Trung Q Nguyen
(74) *Attorney, Agent, or Firm*—Jianq Chyun IP Office

(57) ABSTRACT

Provided is a method for producing a contact device, including a step of forming a first conductive film; a step of forming a second conductive film containing a metal or an alloy of the metal on the first conductive film; a step of forming a third conductive film on the second conductive film; and a step of forming a surface layer on the third conductive film, the surface layer containing an oxidative product of the metal in the second conductive film, which metal has been diffused to be precipitated out from the surface of the third conductive film and oxidized.

15 Claims, 24 Drawing Sheets

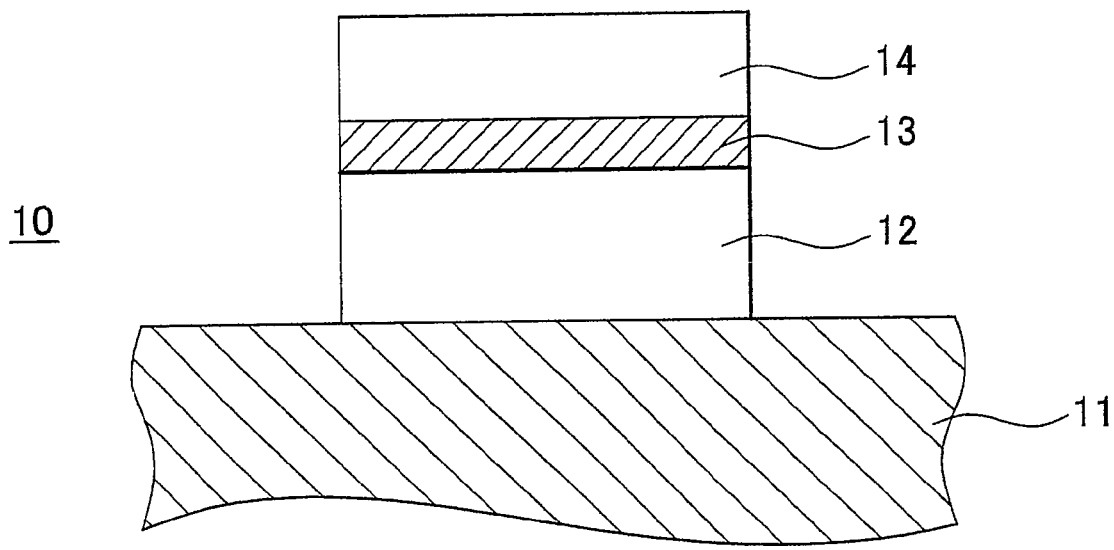
F I G . 1

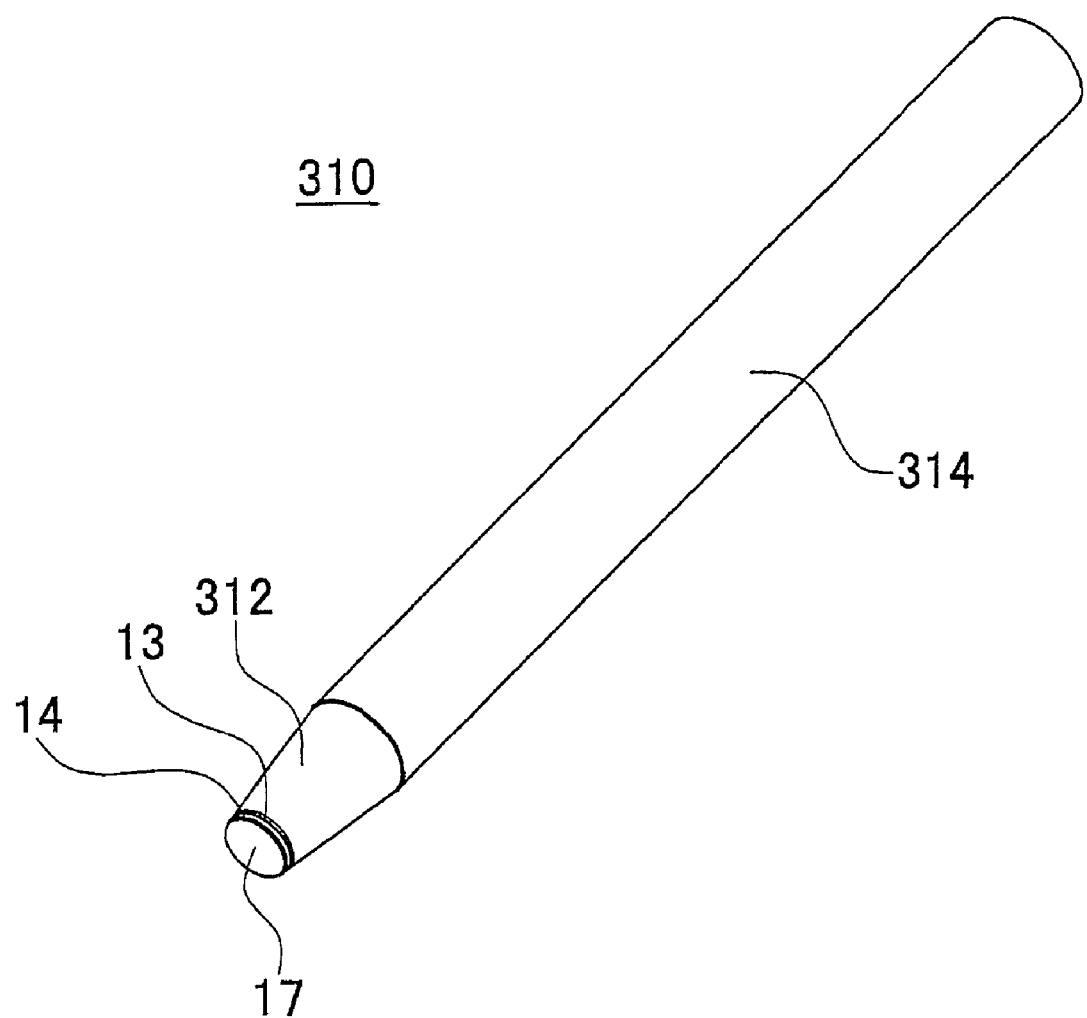
F I G . 22

CONTACT DEVICE AND METHOD FOR PRODUCING THE SAME

CROSS REFERENCE TO RELATED APPLICATION

This is a continuation application of PCT/JP2007/050838 filed on Jan. 19, 2007 which claims priority from a Japanese Patent Application No. 2006-011028 filed on Jan. 19, 2006, and No. 2006-208841 filed on Jul. 31, 2006, the contents of which are incorporated herein by reference.

BACKGROUND

1. Technical Field

The present invention relates to a contact device and a method for producing the contact device. Particularly, the present invention relates to a contact device to be used for a contact device that has a small contact pressure such as a MEMS (MicroElectroMechanical System) switch, and to a method for producing the contact device.

2. Related Art

As an example of a MEMS switch, Patent Literature 1: Japanese Patent Application Publication No. 2003-281988 and Patent Literature 2: Japanese Patent Application Publication No. 2004-055410 describe a contact device made of an Si substrate or the like and produced by a wafer process. Such a contact device is a switch having a moving contact that is displaced by a bimetal or a bimorph, and operates with a minute drive power.

Since such a MEMS switch has a very small contact pressure of 10 mN or smaller, the switch may use a soft metal as the material of its contacts in order to reduce the contact resistance between the contacts. The material of the contacts used for this purpose may be Au or alloys of Au.

The use of a soft metal as the material of the contacts reduces the contact resistance and gives preferable electric properties. However, abutting contacts made of a soft metal might adhere to each other and possibly impede the switch from functioning. The problem here is that a fusion that occurs in the production process decreases the production yield, while a fusion that occurs after the packaging spoils the life of the entire circuit in which this problematic switch is packaged.

A contact device that has a large contact pressure of 10 mN or larger may have a thin oxide film such as a rhodium (Rh) oxide film at the abutting junction of the contacts. Contacts having such a coating may have a longer life, but will have a higher contact resistance between them. Hence, such coated contacts are not suitable for the above-described contact device that has a small contact pressure.

To sum, prevention against a shortened life of contacts due to adhesion and prevention against degeneration of electric properties due to the contact resistance between the contacts are traded off against each other, and both a longer life and a lower contact resistance are not easily realized at a time.

The present invention was made in view of the above problem in the prior art, and aims for providing a contact device that can have a longer life of contacts and a lower contact resistance between the contacts, and a method for producing the contact device.

Hence, it is an object of the present invention to provide a contact device that can overcome the above problem, and a method for producing the contact device. This object can be achieved by combinations described in the independent claims. The dependent claims define further advantageous and exemplary combinations of the innovations herein.

SUMMARY

Therefore, it is an object of an aspect of the innovations herein to provide a contact device and a method for producing the contact device, which are capable of overcoming the above drawbacks. The above object can be achieved by combinations described in the independent claims. The dependent claims define further advantageous and exemplary combinations of the innovations herein.

According to a producing method according to an aspect related to the innovations herein, provided is a method for producing a contact device, including: a step of forming a first conductive film on a support layer; a step of forming a second conductive film containing a metal or a metal alloy on the first conductive film; a step of forming a third conductive film on the second conductive film; and a step of forming a surface layer that is brought into contact with a facing contact, the surface layer containing an oxidative product of the metal in the second conductive film, which metal has been diffused to be precipitated out from a surface of the third conductive film and oxidized. By this method, a very thin surface layer that contains the oxidative product of the metal or metal alloy contained in the second conductive film is formed on the surface of the contact. The surface layer does not increase the contact resistance at the contact, while preventing adhesion between contacts. Accordingly, a contact device with a high production yield, a long life, and fine electric properties is produced.

According to an embodiment, it is preferred in the above method that the temperature for the heat treatment be lower than a temperature at which the metal or the metal alloy gets alloyed with the first conductive film. At such a temperature, the metal or metal alloy in the second conductive film is efficiently diffused into the third conductive film. The first conductive film will not harden due to alloying, and electric properties will not deteriorate.

According to another embodiment, it is preferred in the above method that the temperature for the heat treatment be lower than a temperature at which the metal or the metal alloy gets alloyed with the third conductive film. At such a temperature, the metal or metal alloy in the second conductive film is efficiently diffused into the third conductive film, and further efficiently precipitated out from the surface of the third conductive film.

According to another embodiment, it is preferred in the above method that a diffusion coefficient at which the metal or the metal alloy diffuses in the third conductive film be larger than a diffusion coefficient at which the metal or the metal alloy diffuses in the first conductive film. At such diffusion coefficients, the metal or metal alloy is diffused more efficiently in the third conductive film that in the first conductive film. Therefore, a contact device with a desired structure can be efficiently produced.

According to another embodiment, in the above method, the metal or the metal alloy contains nickel (Ni). The use of Ni, which is easy to procure and inexpensive, improves the production yield and can produce a contact device having a long life and excellent electric properties.

According to another embodiment, in the above method, the first conductive film contains gold (Au), and the third conductive film contains gold (Au) or z gold-palladium (Au—Pd) alloy. Hence, a long-life contact device that has excellent electric properties such as a low contact resistance and that is also chemically stable can be produced.

According to another embodiment, it is preferred in the above method that the content rate of palladium in the third conductive film be 20 atomic percent or lower. At such a content rate, the third conductive film can be kept at a low electric resistance.

According to another embodiment, in the above method, the surface layer contains the oxidative product of the metal or the metal alloy at or above a 30 nm depth from the surface of the surface layer. This can prevent adhesion between contacts without increasing the contact resistance at the contact.

According to a contact device according to an aspect related to the innovations herein, provided is a contact device, including: a metal film made of a metal or a metal alloy; a conductive film formed on the metal film; and a surface layer that is brought into contact with a facing contact, the surface layer containing an oxidative product of the metal or the metal alloy in the metal film, which metal has been diffused into the conductive film to be precipitated out from a surface of the conductive film and oxidized. Hence, a very thin surface layer can be formed on the surface of the contact that can therefore be prevented from adhesion with no increase in the contact resistance.

According to an embodiment, in the above contact device, the surface layer contains the oxidative product of the metal or the metal alloy at or above a 30 nm depth from the surface of the surface layer. Hence, adhesion between contacts can be prevented with no increase in the contact resistance at the contacts.

According to another embodiment, in the above contact device, the metal or the metal alloy contains nickel (Ni). Hence, the above contact device can be formed with a material inexpensive and easy to procure.

According to another embodiment, in the above contact device, the metal or the metal alloy contained in the metal film diffuses, by being heated, into the conductive film to finally reach the contact surface. Hence, when the surface layer is worn, it can be restored.

According to another embodiment, in the above contact device, the metal film is supported by a conductive support layer made of a material that is harder for the metal or the metal alloy to diffuse into than to diffuse into the conductive film. This enables the metal or the metal alloy constituting the metal layer to be efficiently diffused.

According to another embodiment, in the above contact device, the conductive support layer contains gold (Au), and the conductive film contains gold (Au) or a gold-palladium (Au—Pd) alloy. Hence, a contact that is chemically stable and has low contact resistance can be formed.

According to another embodiment, it is preferred in the above contact device that the content rate of palladium in the conductive film be 20 atomic percent or lower. At such a content rate, the electric resistance of the third conductive film can be kept low.

According to a contact device according to an aspect related to the innovations herein, provided is a contact device, including: a fixed contact fixed on a support layer; an actuator that moves close to and away from the support layer; and a moving contact supported by the actuator to be brought into and out of contact with the fixed contact along with the actuator moving close and away. The contact device becomes electrically continuous when the fixed contact and the moving contact are brought into contact. The fixed contact includes: a first conductive film formed on the support layer; a second conductive film formed on the first conductive film and containing a metal or an alloy of the metal; a third conductive film formed on the second conductive film; and a surface layer that is brought into contact with the moving contact, the surface layer containing an oxidative product of the metal in the second conductive film, which metal has been diffused to be precipitated out from a surface of the third conductive film and oxidized. Hence, it is possible to use a contact device with reduced fusion, a high production yield, a long life, a low contact resistance, and excellent electric properties.

According to another embodiment, in the above contact device, the moving contact includes: a first conductive film formed on the actuator; a second conductive film formed on the first conductive film and containing a metal or an alloy of the metal; a third conductive film formed on the second conductive film; and a surface layer that is brought into contact with the fixed contact, the surface layer containing an oxidative product of the metal or the metal alloy in the second conductive film, the oxidative product resulting from a heat treatment in an oxygen atmosphere to diffuse the metal or the metal alloy in the second conductive film to precipitate the metal or the metal alloy out from a surface of the third conductive film to be oxidized. Hence, a contact device having a thick contact, which can be used as a contact of various contact devices, is formed.

According to another embodiment, in the above contact device, the actuator includes a piezoelectric material layer that expands or contracts when a voltage is applied thereto. According to another embodiment, in the above contact device, the actuator includes: a heater that generates heat when energized by a current; and a bimorph including a member that expands when heated by the heater. Hence, a contact device that operates with small electricity and has a low contact resistance, a high yield, and a long life is provided.

According to a switch according to an aspect related to the innovations herein, provided is a switch that includes the above contact device and that, in a semiconductor test apparatus, connects or disconnects a test signal. Hence, a long-life semiconductor test apparatus that can switch test signals without degenerating them is provided.

According to a semiconductor test apparatus according to an aspect related to the innovations herein, provided is a semiconductor test apparatus that includes the above switch. Hence, a long-life semiconductor test apparatus that is highly versatile because of its ability to conduct tests by switching among various test signals is provided.

According to a probe according to an aspect related to the innovations herein, provided is a probe of a semiconductor test apparatus, including at a tip thereof: a metal film made of a metal or a metal alloy; a conductive film formed on the metal film; and a surface layer that is brought into contact with a facing pad, the surface layer containing an oxidative product of the metal or the metal alloy in the metal film, which metal has been diffused into the conductive film to be precipitated out from a surface of the conductive film and oxidized. Hence, a semiconductor can be tested with the use of a probe that has a low contact resistance and a long life. When the surface layer of the probe is worn, a heat treatment can restore the surface layer, which would further prolong the life of the probe.

According to a semiconductor test apparatus according to an aspect related to the innovations herein, provided is a semiconductor test apparatus that includes the above probe. Hence, a semiconductor test apparatus that has a probe having a small contact resistance, and that can conduct precise tests over a long term is provided.

The summary clause does not necessarily describe all necessary features of the embodiments of the present invention. The present invention may also be a sub-combination of the features described above.

BRIEF DESCRIPTION OF THE DRAWINGS

FIG. 1 is a cross section of a contact 10 of a contact device according to an embodiment, observed during production.

FIG. 22 shows the shape and structure of the probe pin 310 packaged on the semiconductor test apparatus 401.

DESCRIPTION OF EXEMPLARY EMBODIMENTS

Figure 2:
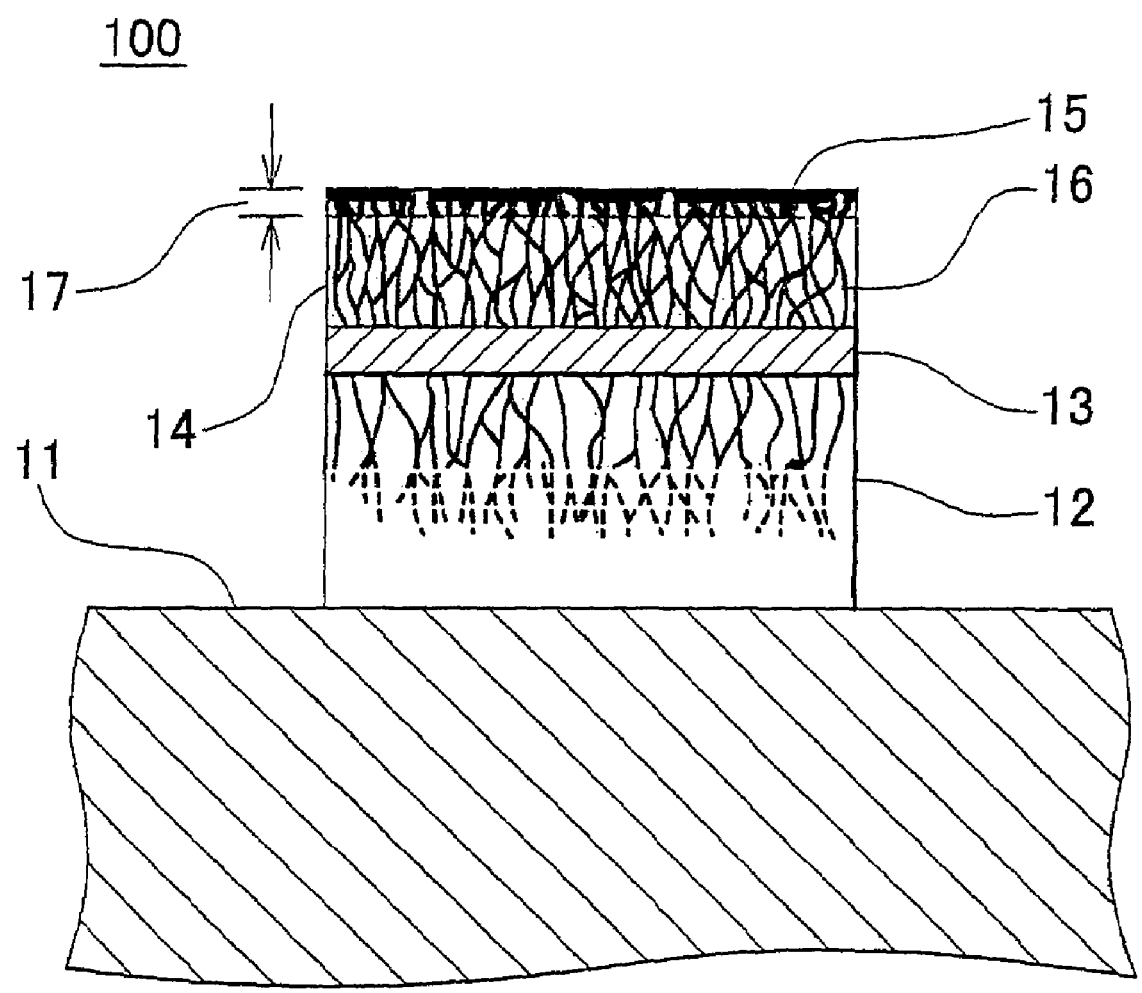
FIG. 2 is a cross section showing the structure of a contact 10 of a contact device according to an embodiment.

An aspect of the present invention will be described below by way of embodiments, which do not intend to limit the invention set forth in the claims. Combinations of features described in the embodiments are not necessarily essential to the solution provided by the invention.

FIG. 1 is a cross section of a layered structure of a contact 10, which is observed during a process of producing a contact device according to an embodiment. As shown in FIG. 1, the contact 10 includes a first conductive film 12 formed on the surface of a base 11, and a second conductive film 13 and third conductive film 14 sequentially stacked on the first conductive film 12.

The process of producing the contact 10 will now be explained. First, the first conductive film 12 is formed by gold (Au) plating on the surface of the base 11 made of an insulator or a dielectric.

Then, the second conductive film 13 made of nickel only or a nickel-chromium (Ni—Cr) alloy is formed on the first conductive film 12 to have a thickness of 100 nm or larger. The third conductive film 14 made of a gold-palladium (Au—Pd) alloy in which the content rate of palladium is 20 atomic percent or lower is formed on the second conductive film 13 to have a thickness of 1 μm or smaller. The second conductive film 13 and the third conductive film 14 are deposited by sputtering. Thus, the contact 10 having the layered structure shown in FIG. 1 is formed. Note that the contact 10 is still in the production process and will be completed through heat treatment to be described below.

FIG. 2 is a cross section of a completed layered structure of the contact 10 that has been through heat treatment. As shown in FIG. 2, the metal or metal alloy alloyed in the second conductive film 13 is heat-treated and diffused into the third conductive film 14 as diffused metal 16, and is finally precipitated upon reaching the surface of the third conductive film 14. The heat treatment is carried out under an oxygen containing atmosphere, and the diffused metal 16 precipitated out from the surface of the third conductive film 14 is exposed to the oxygen containing atmosphere and oxidized. Hence, an oxidative product 15 of the diffused or precipitated metal or metal alloy is formed on and about the surface of the third conductive film 14. In the present example, for the heat treatment, the contact 10 shown in FIG. 1 is heated to 250° C. under a room air or under an oxygen gas.

The contact 10 having heat-treated as described above has the oxidative product 15, which results from the diffused metal 16 being oxidized near the surface of the third conductive film 14. Hence, a surface layer 17 that contains the oxidative product 15 of the diffused metal 16 is formed on and about the third conductive film 14.

It is preferred that the thickness of the third conductive film 14 be determined in consideration of the diffusion coefficient for the diffused metal 16 so that the heat treatment may drive the diffused metal 16 to reach the surface of the third conductive film 14. It is considered that the thickness of the surface layer 17 to be formed is determined by the denseness and diffusive energy of the third conductive film 14, because the thickness of the surface layer 17 becomes generally the same regardless of the temperature of heat and the thickness of the third conductive film 14. In order for the contact resistance at the contact 10 to be, for example, 0.5Ω or lower, the thickness of the surface layer 17 is preferably 30 nm or smaller.

The metal or metal alloy contained in the second conductive film 13 may also diffuse into the first conductive film 12. If the first conductive film 12 has a diffusion coefficient lower than that of the third conductive film 14, the metal or metal alloy can be diffused into the third conductive film 14 efficiently.

In order that the metal or metal alloy contained in the second conductive film 13 be diffused to the surface of the third conductive film 14 in such a state as would be formed into an effective oxide, it is preferred that the temperature of heat for the heat treatment be lower than the temperature at which the second conductive film 13 and the third conductive film 14 are materially alloyed together. Further, in order that the metal or metal alloy contained in the second conductive film 13 be efficiently diffused into the third conductive film 14, it is preferred that the temperature of heat for the heat treatment be lower than the temperature at which the second conductive film 13 and the first conductive film 12 are materially alloyed together.

The combination of materials for the contact device in comprehensive consideration of such conditions as above is, but not limited to, gold (Au) for the first conductive film 12, a nickel-chromium alloy (Ni—Cr) for the second conductive film, and a gold-palladium alloy (Au—Pd) for the third conductive film 14 as already mentioned in the example.

Figure 3:
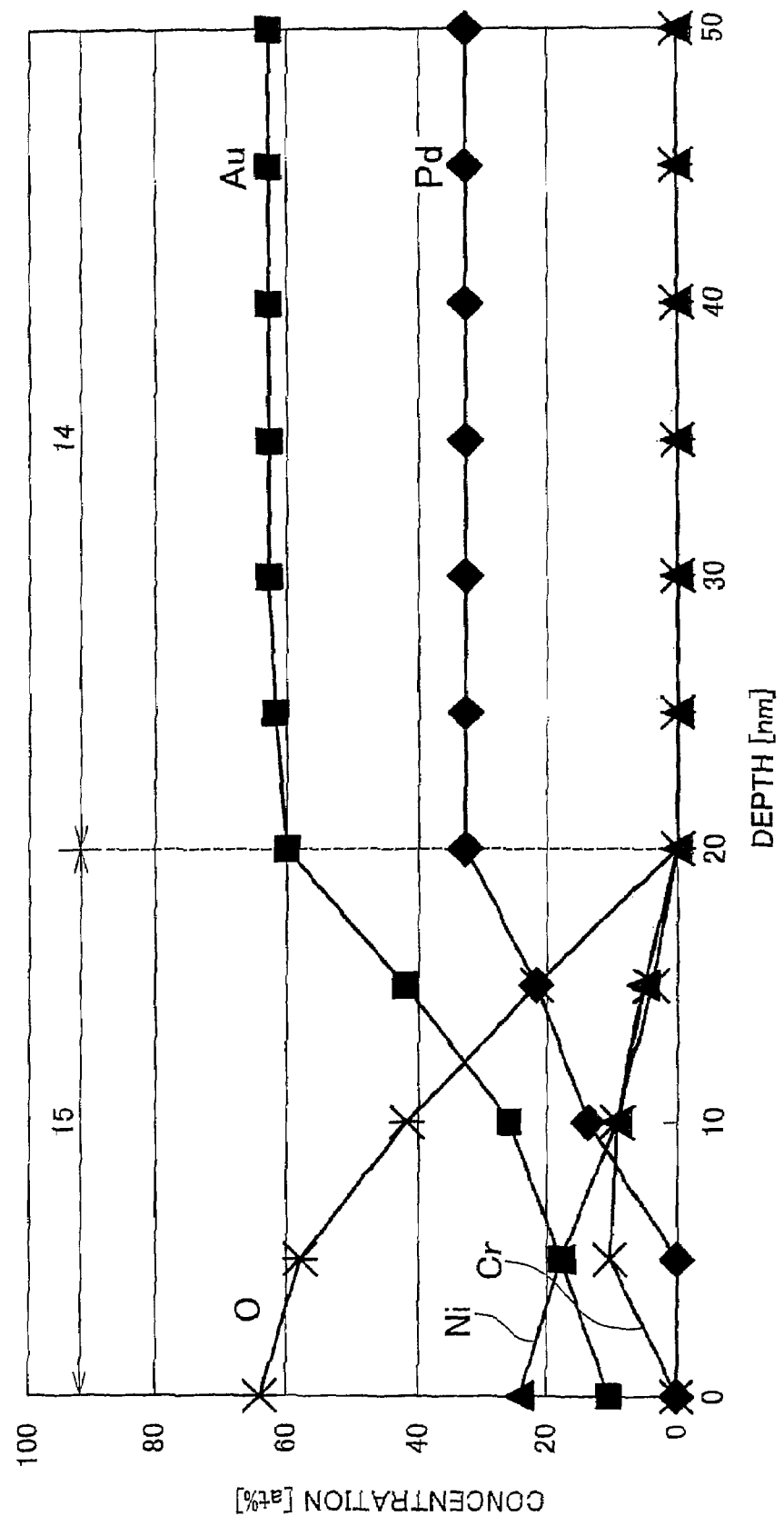
FIG. 3 is a graph showing the distribution of metallic elements measured from the surface of the contact 10 in the thickness-wise direction.

FIG. 3 is a graph plotting the result of measurement by an Auger spectroscopic measurement apparatus about the depthwise distribution of the concentrations of the metallic elements of the contact 10 after the heat treatment, as measured from the surface of the contact 10 downward. In FIG. 3, the vertical axis indicates the concentrations (at %) of the metallic elements on linear scale, and the horizontal axis indicates the thickness-wise depth (nm) measured from the surface of the contact on linear scale. As shown in FIG. 3, the surface layer 17, which is as the surface of the third conductive layer 14 as well, has ample Ni of the diffused metal 16 and ample oxygen at the depths not deeper than about 20 nm, which suggests that the oxidative product 15 of Ni has been formed. This oxidative product 15 blocks the contacts from adhering to each other, as will be described later.

Since the surface layer 17 containing the oxidative product 15 of Ni has a very small thickness of about 20 nm as said above, it is inferred that a tunnel current may even flow through a region where the Ni oxidative product is present. Further, as shown in FIG. 3, Au contained in the third conductive film 14 is also present on the surface of the contact 10. This reveals that the oxidative product 15 that coats the surface of the contact 10 is very thin. Hence, when the contact 10 is brought into contact with another contact, they can have a lower contact resistance between them even if the contact pressure is smaller.

Figure 4:
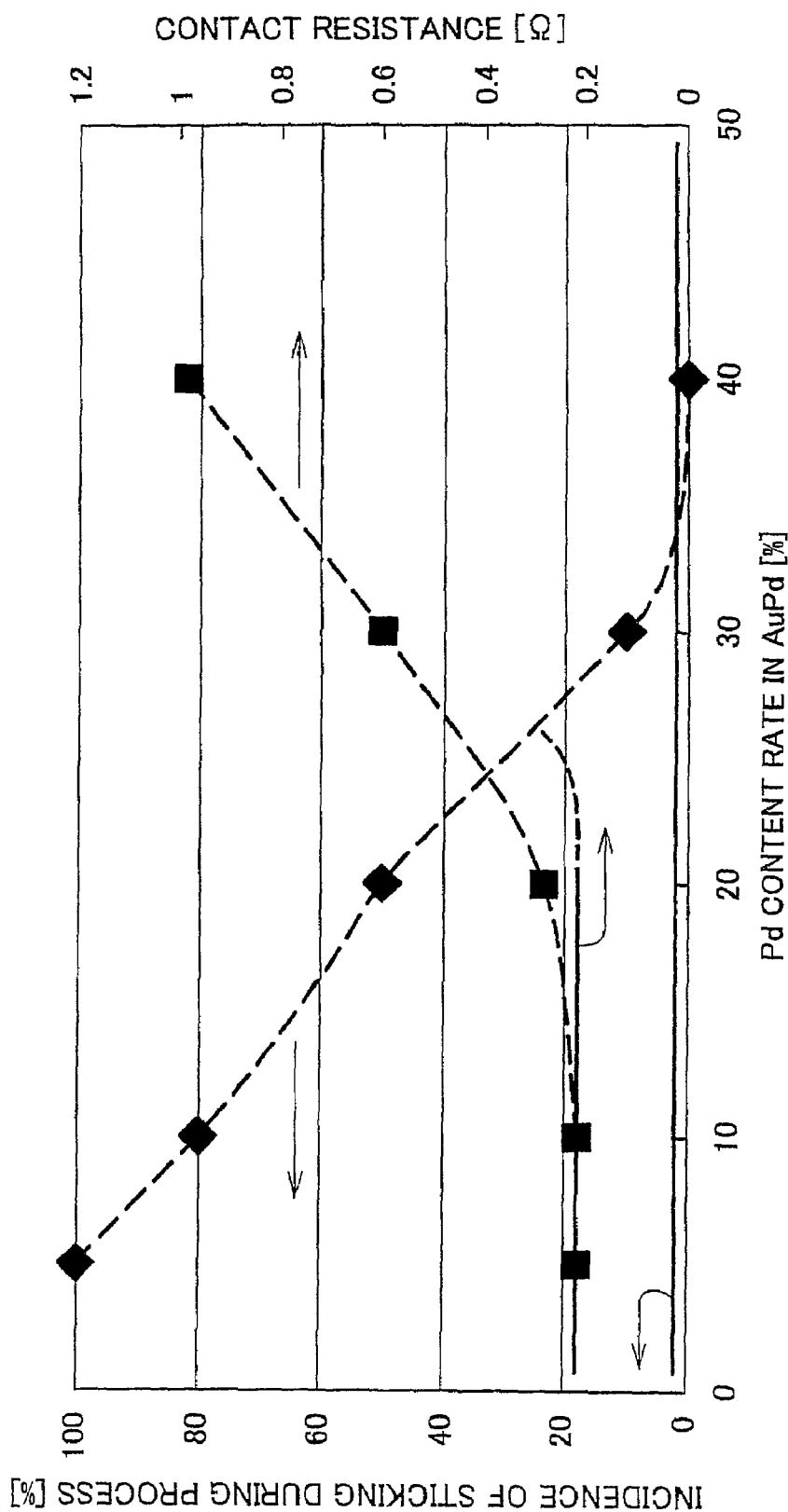
FIG. 4 is a graph showing the dependency on Pd concentration, of the contact resistance at the contact 10 and the incidence of adhesion between the contact 10 and another contact.

FIG. 4 is a graph plotting the result of evaluation on the contact resistance between the contacts and the incidence of fixation between the contacts, as to a contact device that includes the contact 10 produced by the method described above. In FIG. 4, the vertical axis on the left indicates the contact resistance on linear scale, and the vertical axis on the right indicates the incidence of fixation. The horizontal axis indicates the concentration (at %) of Pd in the third conductive film 14 on linear scale. The incidence of fixation is evaluated based on the rate of the number of contact devices that caused fixation, to the total number of contact devices on a single wafer on which, as will be described later, a plurality of contacts have been formed and assembled into the contact devices respectively. This evaluation is indicated in terms of "incidence (%) of sticking during the process". Further, for comparison, the same evaluation was given on contact devices that include the contact 10 having the layered structure shown in FIG. 1, on which no surface layer 17 is formed, and plotted together in FIG. 4. Also as will be described later, since the present contact device includes an actuator that is heat-driven, the contact device is actuated into actual operation even by a temperature rise in the process. Accordingly, the "incidence (%) of sticking during the process" is deeply correlated with incidence of adhesion in actual operations.

As shown in FIG. 4, the contacts having the surface layer containing the Ni oxidative product according to the embodiment described above show a low level of easiness for them to stick to each other, which level is constant regardless of the concentrations of Pd, which indicates that the contacts do not easily stick.

Meanwhile, the contact resistance between the contacts is constant at a low level regardless of the concentrations of Pd up to a Pd concentration of 20 atomic percent, in excess of which the contact resistance shows a certain increase. The contacts having the surface layer 17 containing the Ni oxidative product according to the present embodiment show a certain level of variation in the contact resistance between the contacts, depending on the thickness of the surface layer containing the Ni oxidative product.

In contrast, the contacts having no surface layer containing a Ni oxidative product show fluctuation of the contact resistance and of the easiness to stick depending on the concentrations of Pd in the Au—Pd alloy contained in the topmost layer of the contacts. A trade off can be seen between the contact resistance and the easiness to stick.

Figure 5:
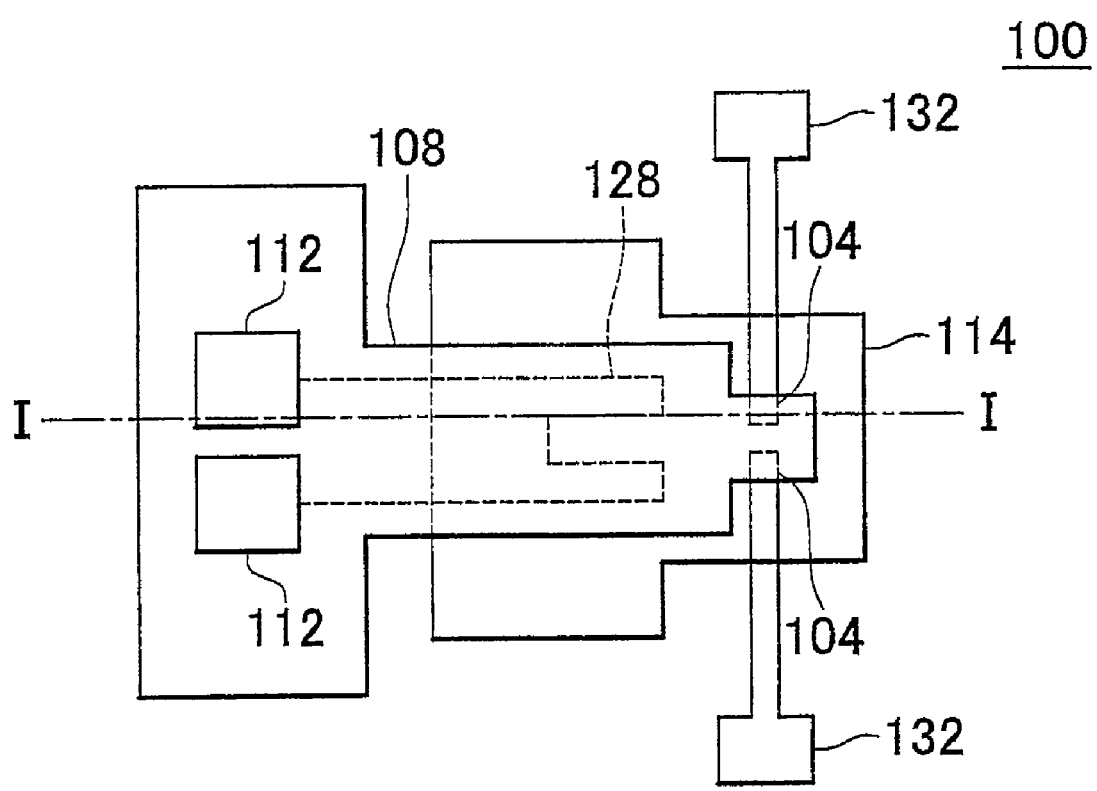
FIG. 5 is a plan view of an example bimorph switch 100 to which the contact device of FIG. 2 is incorporated.
Figure 6:
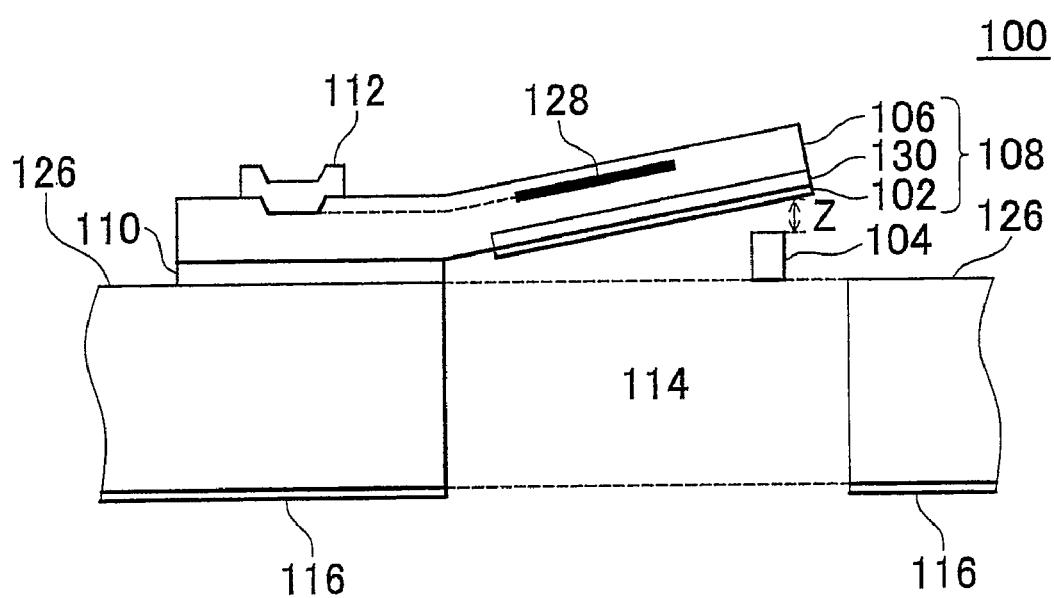
FIG. 6 is a cross section taken along the I-I line of FIG. 5.

FIG. 5 and FIG. 6 show the configuration of a bimorph switch 100, one kind of MEMS switches, to which the above-described contact device is incorporated. FIG. 5 is a plan view, and FIG. 6 is a cross section taken along the I-I line of FIG. 5.

The bimorph switch 100 is a cantilever-beam switch having a cantilever, and includes a substrate 126 made of silicon, a bimorph member 108, a bimorph support layer 110, a moving contact 102, and fixed contacts 104. According to the present embodiment, the fixed contacts 104 incorporate the contact device that has the structure shown in FIG. 2.

The bimorph member 108 serves as the cantilever of the bimorph switch 100. The bimorph member 108 includes a low expansion coefficient member 106, a high expansion coefficient member 130, a heater 128, and a heater electrode 112. The low expansion coefficient member 106 is made of silicon oxide, which has a low coefficient of thermal expansion. The high expansion coefficient member 130 is made of metallic glass, which has a high coefficient of thermal expansion. The heater 128 is made of Cr—Pt—Cr and provided inside the low expansion coefficient member 106. The heater electrode 112 is connected to the heater 128. The bimorph member 108 holds the moving contact 102 that is positioned to be opposed to a through-hole 114 bored in the substrate 126.

The bimorph support layer 110 is made of silicon oxide deposited on the surface of the substrate 126, and supports the bimorph member 108 at one end of the bimorph member 108.

The fixed contacts 104 have their one end fixed on the surface of the substrate 126, and have their contact portion at the other end overhanging the through hole 114 from the transversal sides of the moving contact 102 on the bimorph member 108. A back surface metal layer 116 is formed on the back surface of the substrate 126.

The bimorph member 108 heats the low expansion coefficient member 106 and the high expansion coefficient member 130 by the heater 128 and utilizes the difference in the coefficient of thermal expansion between them, thereby driving the moving contact 102 upward and downward and electrically connecting the moving contact 102 and the fixed contacts 104 above the through-hole 114.

This bimorph switch 100 can be produced as follows. An example producing method will be briefly explained below.

The method for producing the bimorph switch 100 includes a fixed contact forming step, a sacrifice layer forming step, a bimorph member forming step, a removing step, and a moving contact forming step.

In the fixed contact forming step, an Au film, a Ni film or Ni alloy film, and an AuPd film are sequentially formed on the substrate 126 from the bottom upward to form a layered structure, with the use of a thin film deposition technique and a patterning technique as used in production of a semiconductor device. Later, the layered structure will be heated in an oxygen atmosphere so that Ni in the Ni film or Ni alloy film may be diffused, precipitated out from the surface of the AuPd film, and reacted with oxygen to form an Ni oxidative product on the AuPd film. As a result, the fixed contacts 104 will be finished having the layered structure that includes, sequentially from the bottom upward, the Au film, the Ni film or Ni alloy film, the AuPd film, and the Ni oxidative product.

Next, in the sacrifice layer forming step, a sacrifice layer that includes a silicon oxide film to cover the fixed contacts 104 is formed. The sacrifice layer will later become the bimorph support layer 110.

Then, in the bimorph member forming step, the bimorph member 108 is formed on the sacrifice layer, with the use of a thin film deposition technique and a patterning technique as used in production of a semiconductor device.

Then, in the removing step, a portion of the substrate 126 that positionally coincides with the end of the fixed contacts 104 is etched from the back surface of the substrate 126, so that the through-hole 114 is bored through to the surface of the substrate 126. Then, a portion of the sacrifice layer that covers the fixed contacts 104 is removed.

Next, in the moving contact forming step, by deposition or the like from the back surface of the substrate 126, an Au film (first conductive film) to be the bottommost layer, a Ni film or Ni alloy film (second conductive film), and an AuPd film (third conductive film) are formed sequentially from the bottom to form a layered structure, and the back surface metal layer 116 is formed on the back surface of the substrate 126.

Then, in order that the moving contact 102 and the fixed contacts 104 may be formed, heat treatment is performed in an oxygen atmosphere, so that in the regions where the moving contact 102 and the fixed contacts 104 are to be formed, Ni may be diffused through the AuPd film to be precipitated out from the surface of the AuPd film, and reacted with oxygen to form a Ni oxidative product (surface layer) on the surface of the AuPd film. As a result, the moving contact 102 is formed on a surface of the high expansion coefficient member 130 that faces the through-hole 114 in the substrate 126, and the fixed contacts 104 are formed as mentioned above at the positions facing the moving contact 102.

Since the bimorph switch 100 described above that includes the contact devices according to the embodiment includes the contact devices shown in FIG. 2, the bimorph switch 100 can keep the contact resistance between the contacts low while also preventing adhesion between the contacts with their small contact pressure.

The contact device according to the embodiment uses, for example, Ni or a Ni alloy as the metallic material of the second conductive film 13, but this is not essential. Any metal can be used as long as it can diffuse through the third conductive film 14 of a contact and prevent, as an oxidative product, adhesion between contacts that have a small contact pressure.

The first conductive film 12, the second conductive film 13, and the third conductive film 14 are formed by plating, sputtering, and plating respectively, but this is not essential. Any other suitable deposition techniques can be used.

Contacts of some kinds need not include the base 11, as long as the metallic material thereof that corresponds to the first conductive film 12 has a sufficient mechanical strength.

Further, in order that the element that constitutes the second conductive film 13 may not diffuse into the first conductive film 12, a barrier film made of, for example, Pt film, Mo film, W film, or the like may be interposed between the second conductive film 13 and the first conductive film 12 to prevent diffusion of the constituent element of the second conductive film 13.

Figure 7:
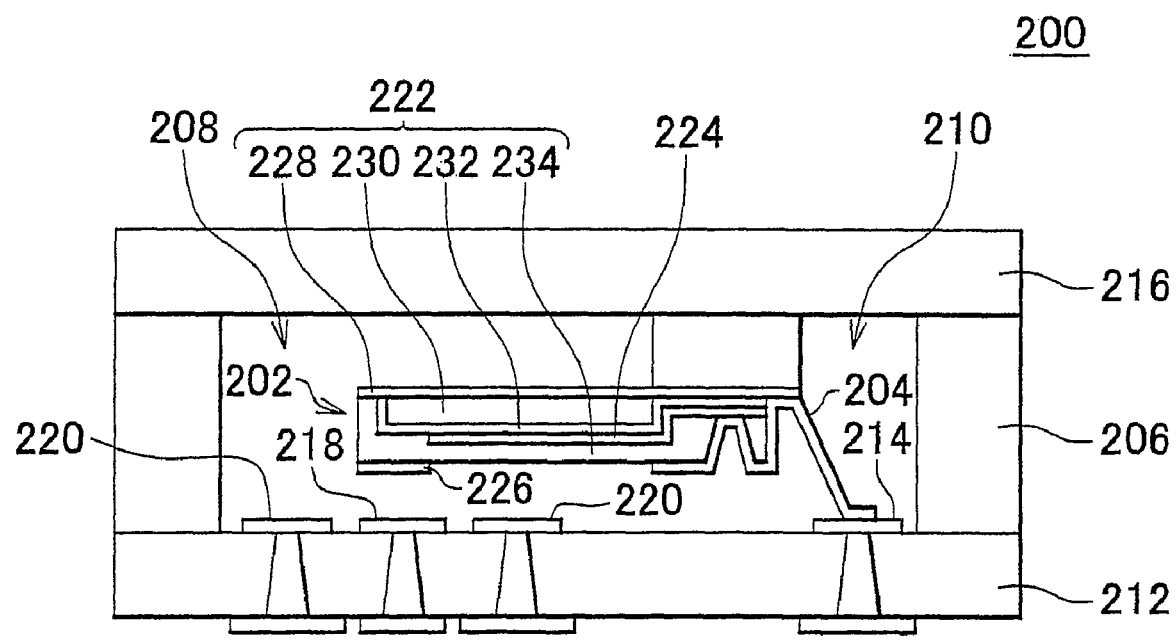
FIG. 7 is a cross section of a micro-switch 200.
Figure 8:
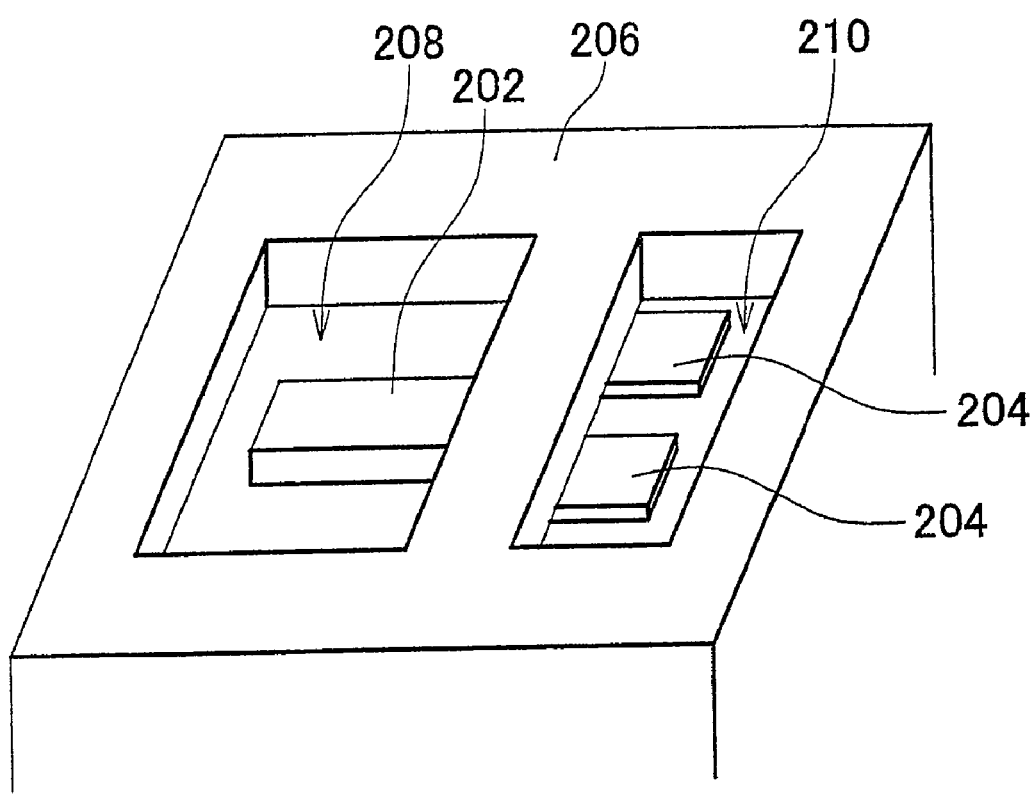
FIG. 8 is a perspective view of a substrate 206.

The contact described above is used as a contact of the bimorph switch 100. This is not essential, but the contact can be used as a contact of any other micro-switch. FIG. 7 is a cross section showing the structure of a micro-switch 200, as a contact device according to another embodiment. FIG. 8 is a top perspective view of the micro-switch 200 shown in FIG. 7.

The micro-switch 200 includes a substrate 206 that suspends a moving member 202, and an interconnection substrate 212 distanced from the moving member 202 in substantially parallel with the substrate 206. A through-hole 208 and a through-hole 210 are bored in the substrate 206. The moving member 202 has its one end fixed on the substrate 206, and has the other end left free above the through-hole 208. The moving member 202 has a moving contact 226, which is the contact of the contact device on one side. The interconnection substrate 212 includes an electrode pad 214 connected to the moving contact 226 via a lead made of a conductive material, a fixed contact 218 or the contact of the contact device on the other side, and ground electrodes 220 disposed in the vicinity of the fixed contact 218. A cap substrate 216 is attached to the top surface of the substrate 206 to block the through-holes 208 and 210. As will be described later, the micro-switch 200 functions when it is electrically connected to the outside.

The moving member 202 includes a bimorph 222 as one example of an actuator, and a heater 224 for heating the bimorph 222. The moving contact 226 is disposed on the verge of the bimorph 222. The bimorph 222 has a layered structure built up of a plurality of materials having different coefficients of thermal expansion, namely a $SiO_2$ layer 228, an Al layer 230, a $SiO_2$ layer 232, and a $SiO_2$ layer 234. The heater 224 is formed of a Cr layer, a Pt layer, and a Cr layer that are stacked up in this order between the $SiO_2$ layer 232 and the $SiO_2$ layer 234. The moving member 202 may be formed of a piezoelectric material or may be formed of a static electrode driven by an electrostatic force, instead of being formed of the bimorph 222.

One end of the lead 204 is connected to the moving member 202 on the verge opposite to the moving contact 226. The other end of the lead 204 is, at about a center axis of the through-hole 210, electrically connected to the electrode pad 214 on the interconnection substrate 212. The lead 204 and the electrode pad 214 may be electrically connected to each other at about a center axis of the through-hole 210 in the direction in which the lead 204 extends. It is preferred that the lead 204 and the electrode pad 214 be made of the same conductive material such as Au. The lead 204 and the electrode pad 214 can be connected to each other mechanically and electrically stably, if they are made of the same conductive material.

The micro-switch 200 described above can be produced by a semiconductor process. The process of producing the micro-switch 200 will be explained below step by step with reference to FIG. 9 to FIG. 14.

Figure 9:
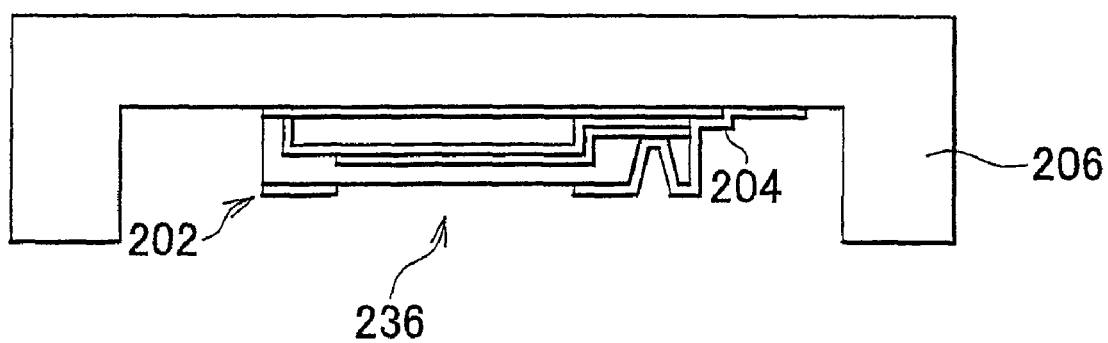
FIG. 9 shows a substrate preparing step, a moving member forming step, and a lead forming step in the production of the micro-switch 200.

FIG. 9 shows a substrate preparing step, a moving member forming step, and a lead forming step. First, in the substrate preparing step, a substrate 206 made of silicon is prepared, as shown in FIG. 9. Next, the lower surface of the substrate 206 is partially etched out to form a recess 236. Then, in the moving member forming step, the materials of the bimorph 222 are stacked sequentially on the bottom of the recess 236 by sputtering or vapor deposition to form the moving member 202. Then, in the lead forming step, a conductive material is stacked on the surface of the moving member 202 and on the bottom of the recess 236 by sputtering or vapor deposition to form the lead 204 on the lower surface of the substrate 206.

Figure 10:
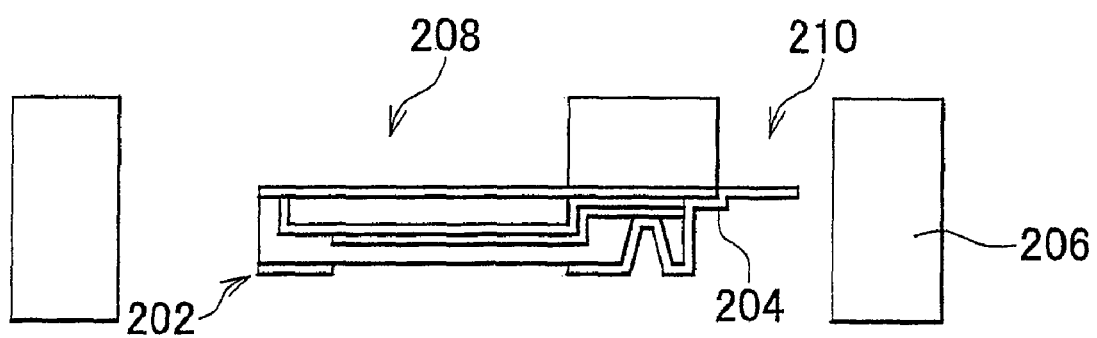
FIG. 10 shows a through-hole forming step in the production of the micro-switch 200.

FIG. 10 shows a through-hole forming step. As shown in FIG. 10, in the through-hole forming step, the through-hole 208 will be formed in the substrate 206 such that one end of the moving member 202 is fixed on the substrate 206 and the other end thereof is left free. The through-hole 210 will be formed in the substrate 206 such that one end of the lead 204 is fixed on the substrate 206 and the other end thereof is left free. Specifically, a resist layer as an etching mask for the substrate 206 is formed on the upper surface of the substrate 206, and the substrate 206 is dry-etched from thereabove so that the substrate 206 is partially removed. At this time, the SiO$_2$ layer 228 of the moving member 202 that contacts the substrate 206 made of Si serves as an etching stopper, and the substrate 206 made of Si is etched till the SiO$_2$ layer 228 appears, thereby the through-hole 208 will be formed. The through-holes 208 and 210 may be formed by wet etching or may be preferably formed by anisotropic etching.

The substrate 206 is etched from its upper surface, which is opposite to the surface on which the moving member 202 is formed, thereby the through-holes 208 and 210 are formed. This process can precisely adjust the amount to be etched and can remove the substrate 206 by a uniform thickness all over the regions where the through-holes 208 and 210 are formed. Since the through-holes 208 and 210 can be formed with high dimensional accuracy, the length of the portion of the moving member 202 that extends toward the through-hole 208, the length of the portion of the lead 204 that extends toward the through-hole 210, and the size of the airtight space, i.e., the space enclosed by the substrate 206, the interconnection substrate 212, and the substrate 216 can be precise. In this way, micro-switches 200, the moving member 202 of which is displaced to a desired degree by a predetermined level of power, can be reproducibly produced with device-by-device unevenness reduced.

Figure 11:
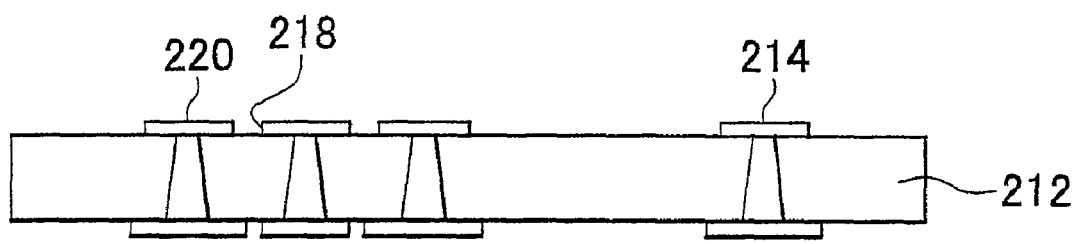
FIG. 11 shows an interconnection substrate preparing step in the production of the micro-switch 200.

FIG. 11 shows an interconnection substrate preparing step. As shown in FIG. 11, the interconnection substrate 212 has the ground electrodes 220, the fixed contact 218, and the electrode pad 214. The ground electrodes 220, the fixed contact 218, and the electrode pad 214 of the interconnection substrate 212 are continuous to the lower surface of the interconnection substrate 212 through via-holes. The fixed contact 218, the contact of the contact device on one side, is further formed to have the layered structure having the surface layer 17, through the process already explained with reference to FIG. 1 and FIG. 2.

Figure 12:
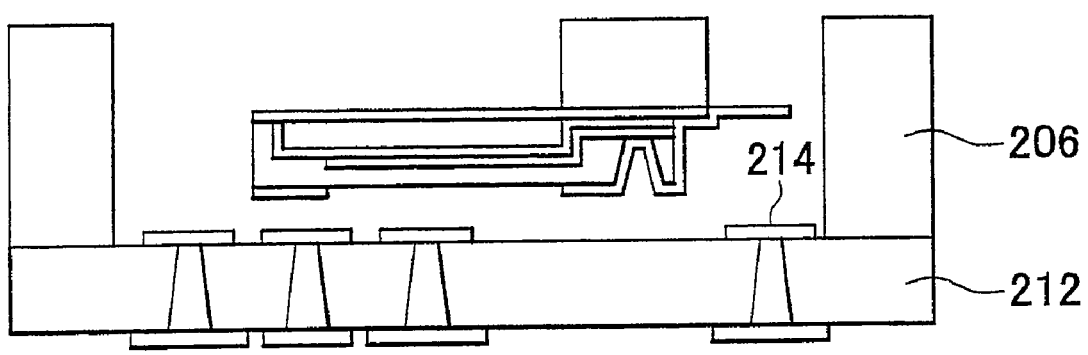
FIG. 12 shows a fixing step in the production of the micro-switch 200.

FIG. 12 shows a fixing step. As shown in FIG. 12, the substrate 206 and the interconnection substrate 212 are fixed such that the lower surface of the substrate 206 faces the interconnection substrate 212. When the interconnection substrate 212 is a glass substrate, the substrate 206 and the interconnection substrate 212 can be bonded by anodic bonding. A metallic film may be formed on the bonding surface of both the substrate 206 and the interconnection substrate 212, so that the substrate 206 and the interconnection substrate 212 may be bonded by metal binding.

Figure 13:
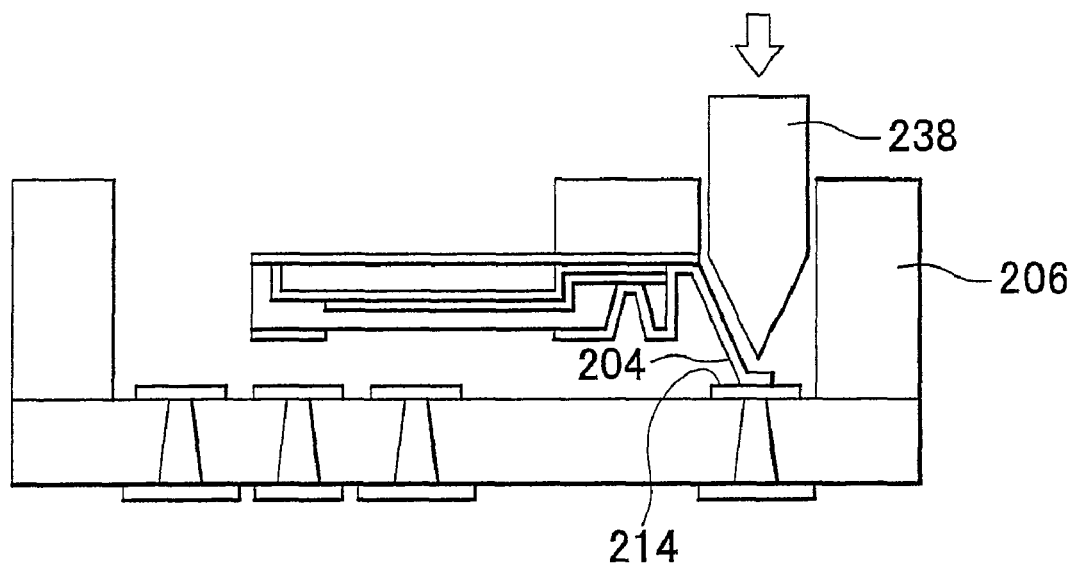
FIG. 13 shows an electrically connecting step in the production of the micro-switch 200.

FIG. 13 shows an electrically connecting step. As shown in FIG. 13, the lead 204 attached on the substrate 206 is bonded to the electrode pad 214 on the interconnection substrate 212 in this step. The lead 204 is electrically connected to the electrode pad 214 with a bend of its portion that extends toward the through-hole 210. The tip of a bonding tool 238 is inserted into the through-hold 210 from the upper surface of the substrate 206 downward, thereby the lead 204 can be bent and pressed onto the electrode pad 214. At this time, a bonding tool 238 having substantially the same width as that of the through-hole 210 may be inserted into the through-hole 210 to press the lead 204 onto the electrode pad 214. A bonding tool 238 having a cross-sectional shape that is substantially the same, in the planar directions of the substrate 206, as that of the through-hole 210 may be inserted into the through-hole 210 to press the lead 204 onto the electrode pad 214. The bonding tool 238 may be, for example, a wedge for ultrasonic wire bonding, and can give ultrasonic vibration to the lead 204 to press it fixed on the electrode pad 214. With direct contact between the lead 204 and the electrode pad 214 when they are to be pressed fixed, they can be electrically connected to each other firmly.

Figure 14:
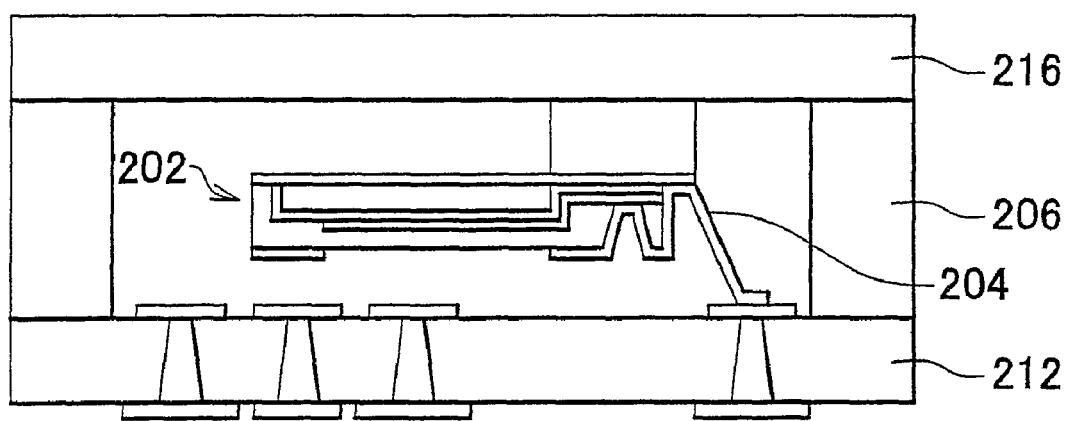
FIG. 14 shows a sealing step in the production of the micro-switch 200.

FIG. 14 shows a sealing step. As shown in FIG. 14, the substrate 206 and the substrate 216 are fixed together on the upper surface of the substrate 206 to block the through-holes 208 and 210, so that the moving member 202 and the lead 204 are hermetically sealed by the substrate 206, the interconnection substrate 212, and the substrate 216. When the substrate 216 is a glass substrate, the substrate 206 and the substrate 216 can be bonded by anodic bonding. A metallic film may be formed on the bonding surface of both the substrate 206 and the substrate 216, so that the substrate 206 and the substrate 216 may be bonded by metal binding. In this way, the micro-switch 200 having the structure shown in FIG. 7 and FIG. 8 is completed.

FIG. 15 to FIG. 19 show an industrial process of producing the above-described micro-switch 200 step by step.

Figure 15:
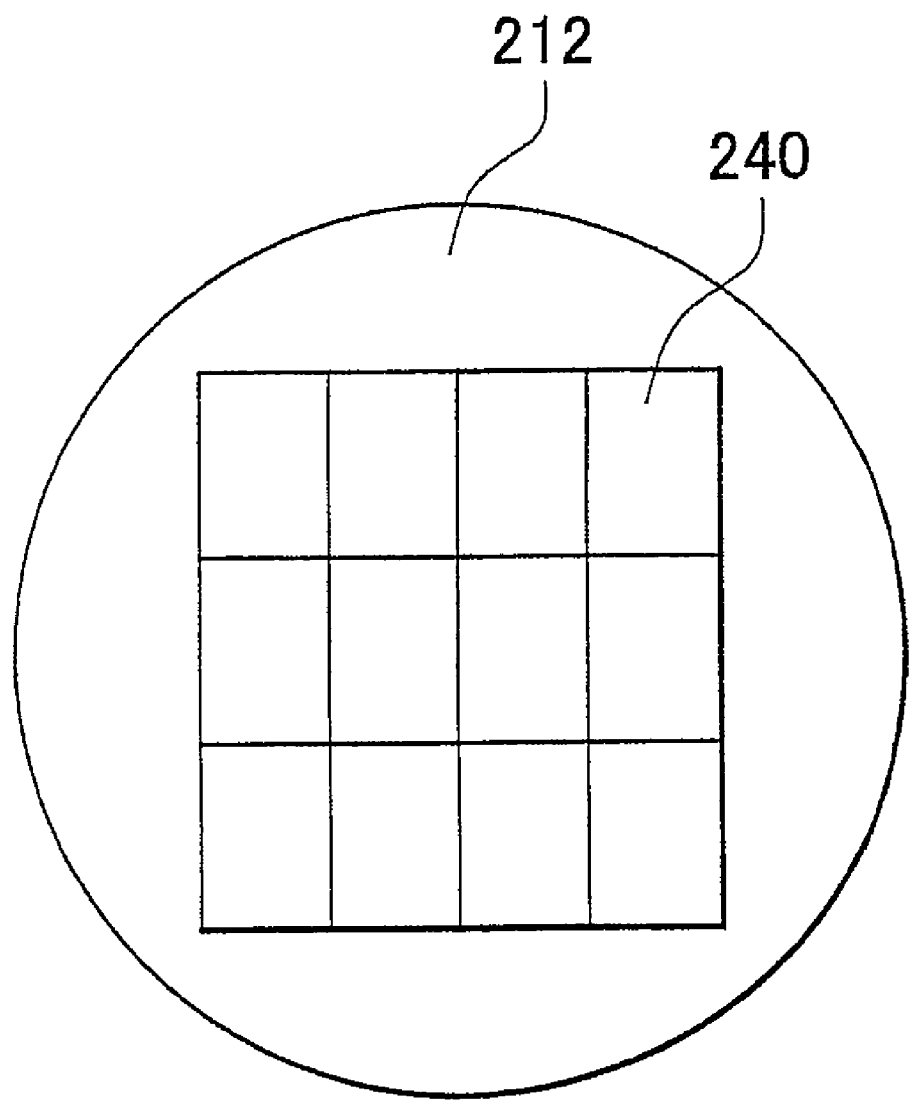
FIG. 15 shows a whole interconnection substrate 212.

FIG. 15 shows a whole Si substrate, from which the interconnection substrate 212 will be formed. As shown in FIG. 15, a plurality of regions 240, each of which will be the interconnection substrate 212, are simultaneously formed on a single Si substrate. The electrode pad 214, the fixed contact 218, and the ground electrodes 220 as shown in FIG. 11 are formed on each of the regions 240. Heat treatment for the fixed contact 218 is carried out for the whole Si substrate simultaneously.

Figure 16:
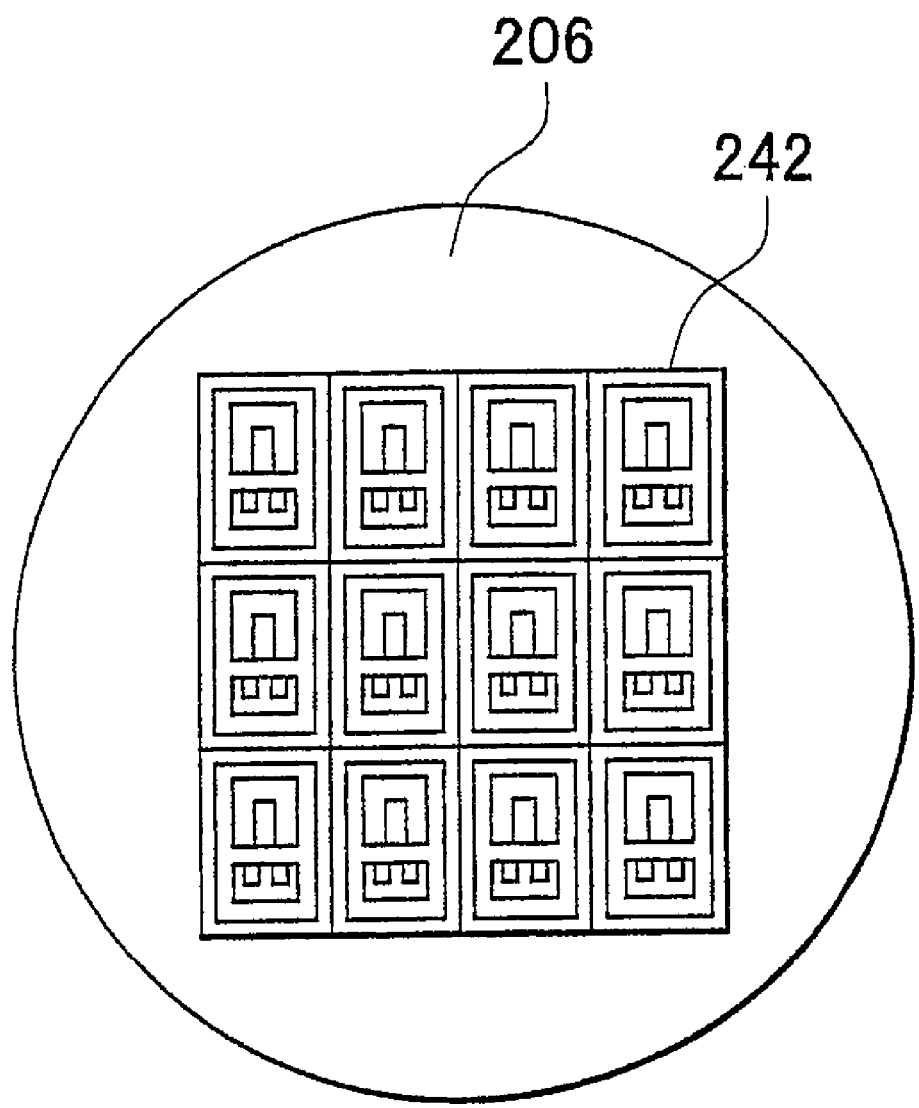
FIG. 16 shows a whole substrate 206.

FIG. 16 shows a whole Si substrate, from which the substrate 206 will be formed. Likewise, the moving member forming step of FIG. 9 to FIG. 10 is carried out on a plurality of regions 242 of the substrate 206 simultaneously, as shown in FIG. 16. Thereby, the moving member 202 and the lead 204 shown in FIG. 7 and FIG. 8 are formed on each of the regions 242. Likewise, the through-hole forming step is carried out so that the through-hole 208 is formed for each of the plurality of moving members 202 formed on the substrate 206, and so that the through-hole 210 is formed for each of the plurality of leads 204.

Figure 17:
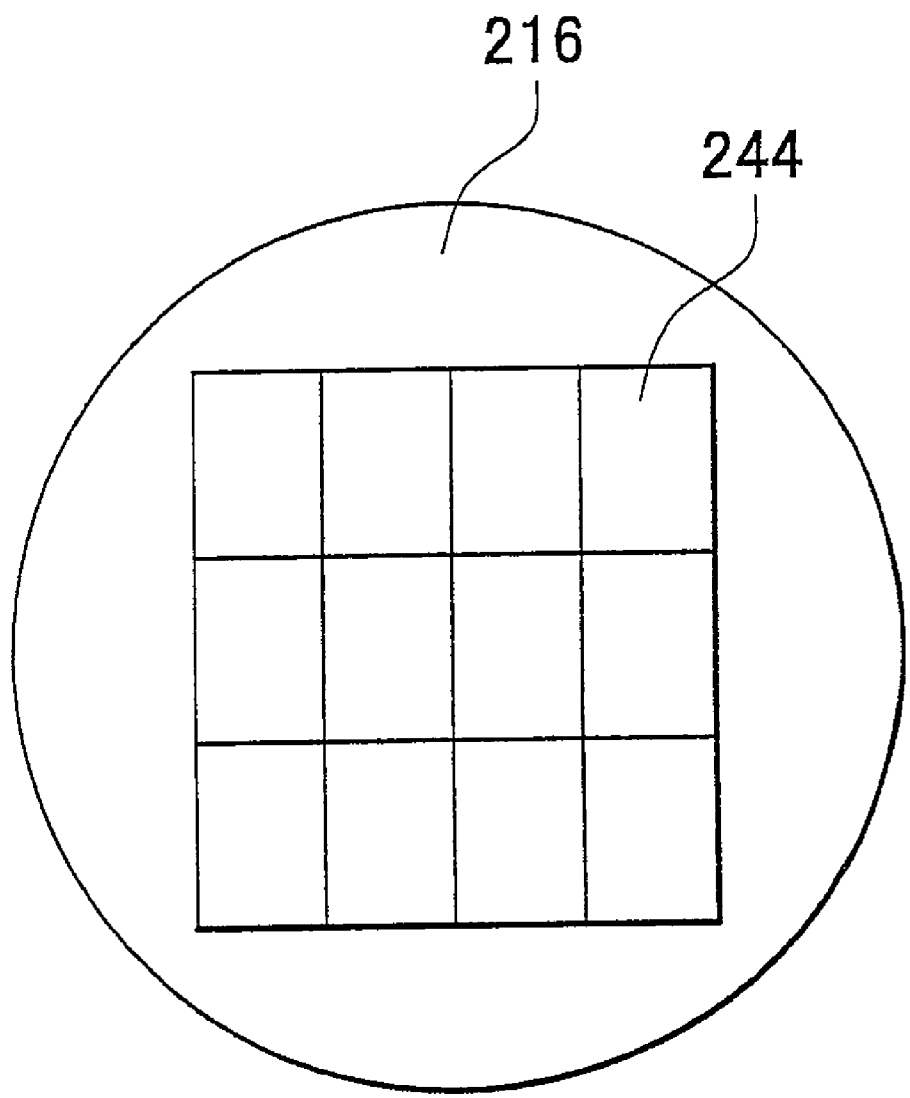
FIG. 17 shows a whole substrate 216.

FIG. 17 shows a whole Si substrate, from which the substrate 216 will be formed. As shown in FIG. 17, a plurality of regions 244, each of which will be the substrate 216, one part of the micro-switch 200, are formed simultaneously on the single Si substrate.

Figure 18:
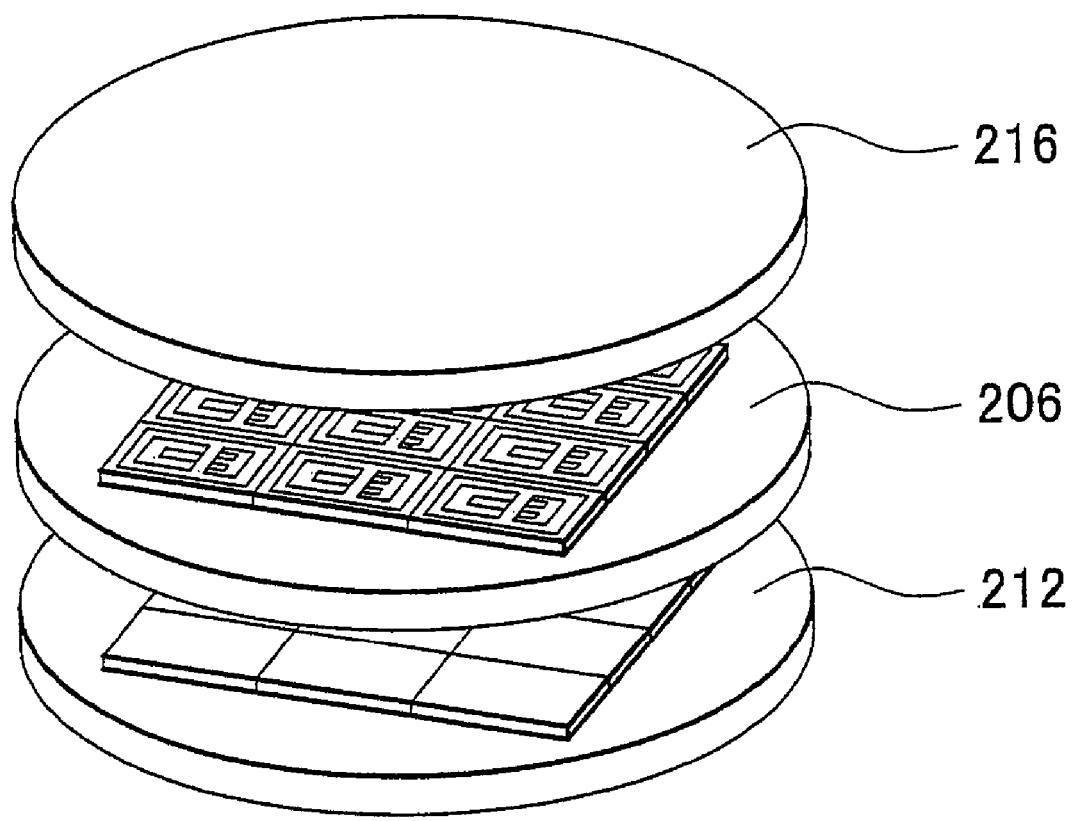
FIG. 18 shows a fixing step, a sealing step, and an electrically connecting step.

FIG. 18 shows the fixing step, the sealing step, and the electrically connecting step for the Si substrates shown in FIG. 15 to FIG. 17. As shown in FIG. 18, the interconnection substrate 212, on which the electrode pad 214 is formed, and the substrate 206 on which the moving member 202 and the lead 204 are formed, are fixed together in the fixing step. Next, the bonding tool 238 is inserted into the plurality of through-holes 210 to electrically connect the leads 204 to the plurality of electrode pads 214 respectively in the electrically connecting step. At this time, it is preferred that a bonding tool 238 having tips to be inserted into the plurality of through-holes 210 respectively be used so that the plurality of leads 204 and the plurality of electrode pads 214 are electrically connected to each other simultaneously. Then, in the sealing step, the substrate 206 and the substrate 216 are fixed together to individually seal the plural sets of the moving member 202 and the lead 204.

Figure 19:
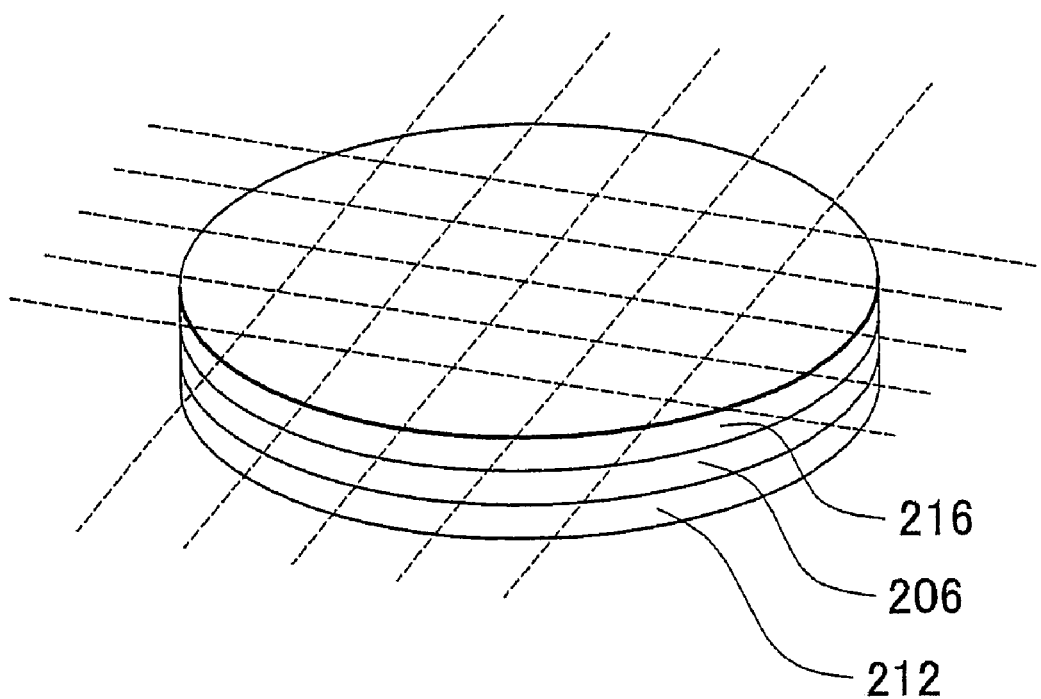
FIG. 19 shows a dicing step.

FIG. 19 shows a dicing step. As shown in FIG. 19, in the dicing step after the sealing step, with the moving member 202 and the lead 204 sealed, the substrate 206, the interconnection substrate 212, and the substrate 216 are diced, so that the substrates are chip-sized into the respective microswitches 200. In the dicing step, water is poured to flow over the surface of the Si substrate while dicing, in order that a temperature rise due to the dicing may be prevented. Since the micro-switches 200 are diced after they are sealed, the moving member 202 and the lead 204 can be protected from the water pressure.

Figure 20:
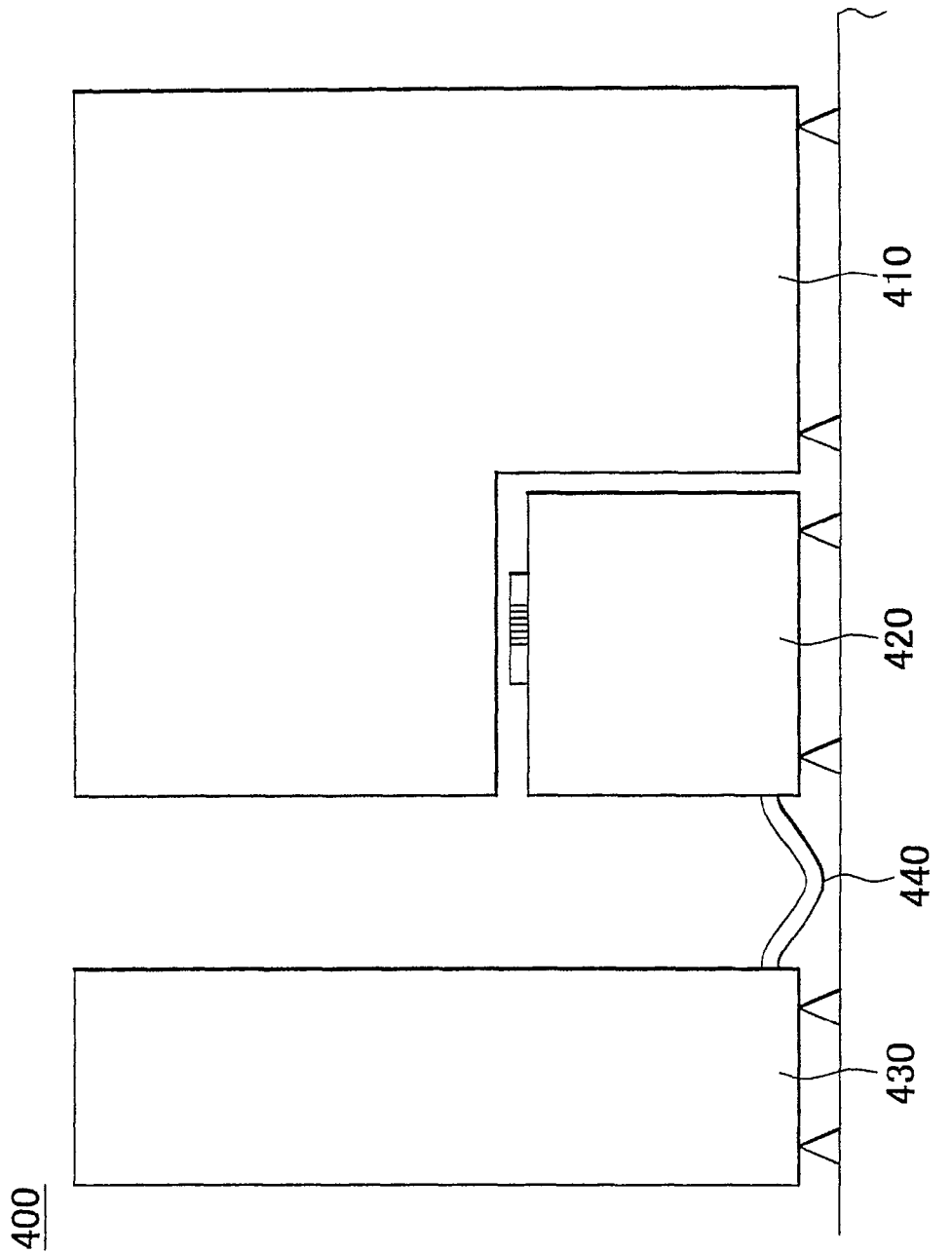
FIG. 20 exemplary shows the whole structure of a semiconductor test apparatus 400 that includes contact devices of various kinds.

FIG. 20 exemplary shows the whole structure of a semiconductor test apparatus 400 that includes contact devices of various kinds. As shown in FIG. 20, the semiconductor test apparatus 400 includes a handler 410 that physically guides a semiconductor device under test 450, a test head 420 that tests semiconductor devices under test 450 fed one after another by the handler 410, and a main apparatus 430 that controls the test on the semiconductor devices under test 450 and evaluates the test results.

The main apparatus 430 is connected to the test head 420 via a cable 440, thereby controlling the test head 420. The test head 420 is electrically coupled to each of the semiconductor devices under test 450 fed by the handler 410 each time one is fed, so that the main apparatus 430 can test the semiconductor device under test 450. The semiconductor device under test 450 evaluated based on the result of the test conducted is transported again by the handler 410 to be classified and stored based on the evaluation.

Such a semiconductor test apparatus 400 conducts various tests on each semiconductor device to be tested, including a function test for inspecting the function of the device, a DC parametric test for inspecting the operating voltage, logic levels, etc., an AC parametric test for inspecting operation timings, etc. and the like. For this reason, the test head 420 has different signal sources and a selector switch 201 to be able to couple the semiconductor device under test to different signal sources.

Figure 21:
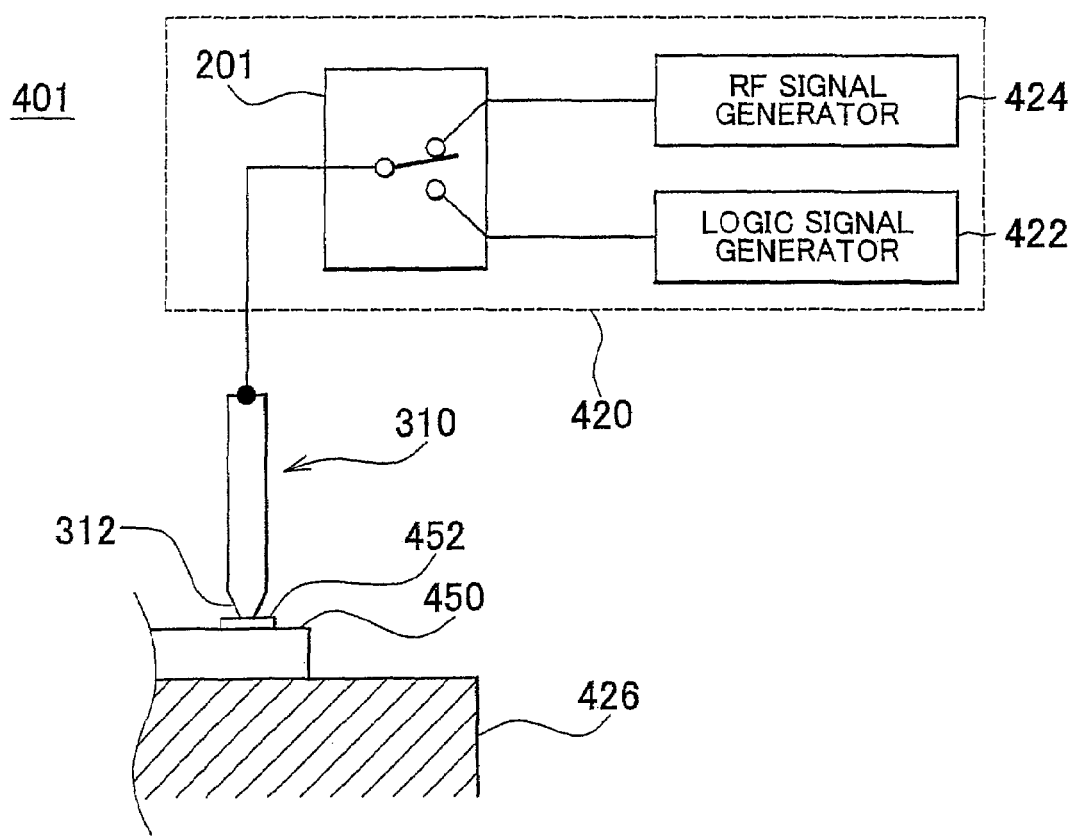
FIG. 21 exemplarily shows the functions of a selector switch 201 and a probe pin 301, which are examples of contact devices included in a semiconductor test apparatus 401.

FIG. 21 is a block diagram of an exemplary structure of a semiconductor test apparatus 401 that has a selector switch 201 and probe pin 310, as contact devices. As shown in FIG. 21, the test head 420 of the semiconductor test apparatus 401 has a plurality of testing functions such as a logic signal generator 422 and a RF signal generator 424, and can connect a desired signal to the semiconductor device under test 450 via the selector switch 201.

In the semiconductor test apparatus 401, a signal path is routed to the semiconductor device under test 450 via the probe pin 310. That is, the tip 312 of the probe pin 310 is brought into contact with a pad 452 of the semiconductor device under test 450 placed by the hander 410 on a probe stage 426, thereby the test head 420 and the semiconductor device under test 450 are electrically connected. Further, the selector switch 201 is actuated to make the probe pin 310 selectively transmit the logic signal generator 422 or the RF signal generator 424 to the semiconductor device under test 450 and enable a desired testing action to be performed.

Since the probe pin 310 merely contacts the pad 452, the semiconductor device under test 450 can be released from electrical connection by a lift of the probe pin 310 and can be easily replaced by the next semiconductor device under test 450. FIG. 21 shows only one unit for each component, but an actual semiconductor test apparatus 401 is packaged with as many probe pins 310 and as many selector switches 201 as the pads 452 formed in multitude on the semiconductor device under test 450. Accordingly, it is preferred that each selector switch 201 and each probe pin 301 be smaller, and that each selector switch 201 operate with a lower power. From this viewpoint, the micro-switch 200 having a micro structure as shown in FIG. 7 is suitable as the selector switch 201.

The probe pin 310 is required to transmit a test signal to the semiconductor device under test 450 without degenerating it. The probe pin 310 as well repetitively lands on and takes off from the pad 452 every time the semiconductor devices under test 450 are replaced. Hence, each probe pin 310 is required to cause a lower contact resistance and to have a longer-term withstandness against fixation. From this viewpoint too, the selector switch 201 having the contact structure shown in FIG. 2 is suitable.

FIG. 22 exemplarily shows the shape and structure of such a probe pin 310. As shown in FIG. 22, the probe pin 310 has a tapered tip 312 and a cylindrical main portion 314. The tip 312 contacts the pad 452 of the semiconductor device to be tested to electrically connect the test head 420 and the semiconductor device. The main portion 314 supports the tip 312 at the back, and intermediates in the electrical connection with the internal circuit of the test head 420.

The tip 312 of the probe pin 310 contacts the pad 452 of the semiconductor device under test 450 and forms a temporary electrical connection for the test. In this case, a large pressure as would damage the semiconductor device cannot be applied. On the other hand, since a signal or electricity of a similar level to that applied when the semiconductor device to be tested is used for an actual purpose as packaged on a certain circuit is applied to the semiconductor circuit during the test, the probe pin 310 and the pad 452 are required to have therebetween fine electric properties comparable to those obtained when they are soldered or bonded, in order for the test to be effective. For this reason, it is preferred that the layered structure shown in FIG. 2 that includes the second conductive film 13 and the third conductive film 14 be formed on the tip 312 of the probe pin 310 that contacts the pad 452 of the semiconductor device. The surface layer 17 that contains the oxidative product of the metal or metal alloy of the second conductive film 13 is formed on the tip surface of the tip 312 of the probe pin 310 by the heat treatment. As a result, the probe pin 310 and the pad 452 are electrically connected finely, and at the same time the probe pin 310 and the pad 452 are prevented from adhesion.

Figure 23:
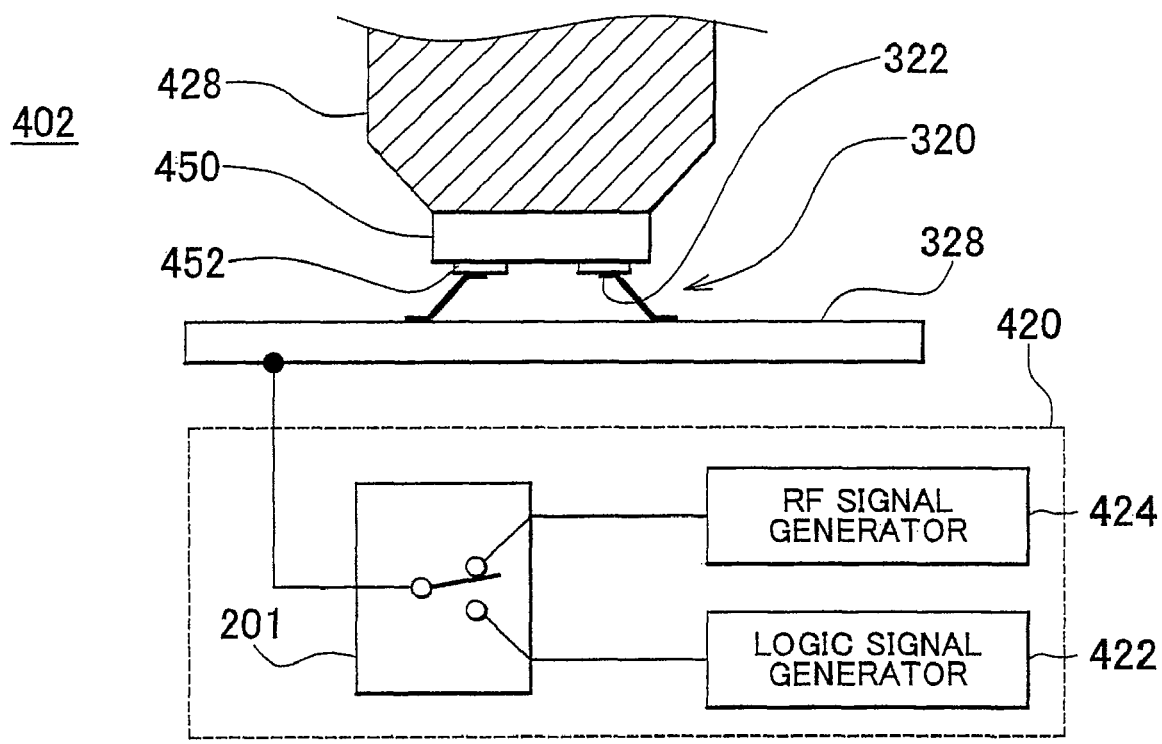
FIG. 23 exemplarily shows the functions of a selector switch 201 and a probe pin 320, which are other examples of contact devices included in the semiconductor test apparatus 400.

FIG. 23 is a block diagram showing an exemplary structure of a semiconductor test apparatus 402 that has a selector switch 201 and probe pin 320 as contact devices. As shown in FIG. 23, the test head 420 of the semiconductor test apparatus 402 as well has a plurality of testing functions such as a logic signal generator 422 and a RF signal generator 424, and can connect a desired signal to the semiconductor device under test 450 via the selector switch 201.

In the semiconductor test apparatus 401, a signal path is routed to the semiconductor device under test 450 via the probe pin 320. That is, a plurality of probe pins 320 are mounted on the upper surface of a probe substrate 328. The pads 452 of the semiconductor device under test 450 secured on a pusher 428 are brought into contact with these probe pins 320 from above, thereby electrically connecting the test head 420 and the semiconductor device under test 450. The selector switch 201 can be actuated to allow the probe pins 320 to selectively transmit the logic signal generator 422 or the RF signal generator 424 to the semiconductor device under test 450 to enable a desired testing action to be performed.

The semiconductor test apparatus 402 is also packaged with as many probe pins 320 and as many selector switches 201 as the pads 452 formed in multitude on the semiconductor device under test 450. The probe substrate 328 having many probe pins 320 is called probe card or the like, and is fixed on an unillustrated performance board of the semiconductor test apparatus 402 for use.

The tip 322 of the probe pin 320 is pressed against the pad 452 by the elasticity of the probe pine 320. Hence, the semiconductor device under test 450 can be released from electrical connection by the pusher 428 lifting the semiconductor device under test 450, and can be easily replaced by the next semiconductor device under test 450.

The probe pin 320 also repetitively lands on and takes off from the pad 452 every time the semiconductor devices under test 450 are replaced. Further, the probe pin 320 is also required to transmit a test signal to the semiconductor device under test 450 without degenerating it. Hence, each probe pin 320 is required to cause a lower contact resistance and to have a longer-term withstandness against fixation.

Figure 24:
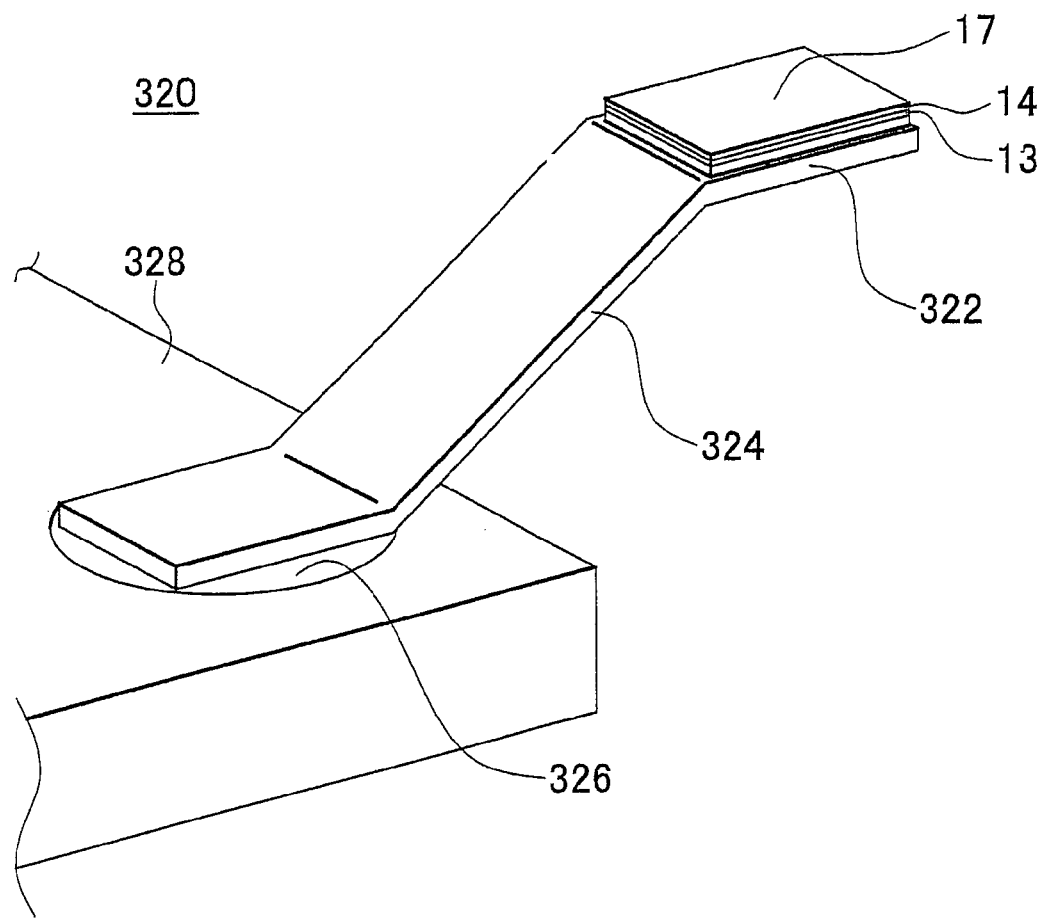
FIG. 24 shows the shape of structure of the probe pin 320 packaged on the semiconductor test apparatus 402.

FIG. 24 exemplarily shows the shape of structure of such a probe pin 320. As shown in FIG. 24, the probe pin 320 has its one end bonded to the probe substrate 326 with an adhesive material 326. The other end of the probe pin 320, which is the tip 322 of the probe pin 320 that leads to the one end via a thin and long main portion 324, has thereon a flat tip surface 322 that contacts the pad 452 of the semiconductor device under test 450.

The layered structure shown in FIG. 2 that includes the second conductive film 13 and the third conductive film is formed on the tip 322 of the probe pin 320. The surface layer 17 that contains the oxidative product of the metal or metal alloy of the second conductive film 13 is formed on the tip surface of the tip 322 of the probe pin 320 by the heat treatment. As a result, the probe pin 320 and the pad 452 are finely electrically connected, and at the same time the probe pin 320 and the pad 452 are prevented from adhesion.

Although an aspect of the present invention has been described by way of exemplary embodiments, the technical scope of the present invention is not limited to the scope of disclosure of the above embodiments. Various changes or alterations can be added upon the above embodiments. It is clear from the claims that embodiments including such changes or alterations can also be included in the technical scope of the present invention.

As clear from the above explanation, according to an embodiment of the present invention, it is possible to realize a contact device that can prevent adhesion between contacts without increasing the contact resistance, and a method for producing such a contact device. That is, this contact device has a surface layer containing the oxidative product of a metal or a metal alloy on the surface of the contact that is brought into contact with a facing contact. As will be described later, this surface layer is very thin, which would prevent the conductive film from hardening and would prevent increase in the contact resistance at the contacts despite the surface layer contains an oxide, which is generally non-conductive. With the intermediating surface layer between the facing contacts, adhesion between the contacts is prevented.

It is possible to form such a surface layer, by diffusing a metal or a metal alloy into a conductive film that will support the to-be surface layer, and exposing the metal or the metal alloy that diffuses and precipitates out from the surface of the conductive film in an oxygen atmosphere.

What is claimed is:

1. A method for producing a contact device, comprising:
a step of forming a first conductive film on a support layer;
a step of forming a second conductive film containing a metal or a metal alloy on the first conductive film;
a step of forming a third conductive film on the second conductive film; and
a step of forming a surface layer that is brought into contact with a facing contact, the surface layer containing an oxidative product of the metal in the second conductive film, which metal has been diffused to be precipitated out from a surface of the third conductive film and oxidized.

2. The method according to claim 1,
wherein the step of forming the surface layer includes a heat treatment in an oxygen atmosphere.

3. The method according to claim 2,
wherein a temperature for the heat treatment is lower than a temperature at which the metal or the metal alloy gets alloyed with the first conductive film.

4. The method according to claim 2,
wherein a temperature for the heat treatment is lower than a temperature at which the metal or the metal alloy gets alloyed with the third conductive film.

5. The method according to claim 1,
wherein a diffusion coefficient at which the metal or the metal alloy diffuses in the third conductive film is larger than a diffusion coefficient at which the metal or the metal alloy diffuses in the first conductive film.

6. The method according to claim 1,
wherein the metal or the metal alloy contains nickel (Ni).

7. The method according to claim 1,
wherein the first conductive film contains gold (Au), and the third conductive film contains gold (Au) or a gold-palladium (Au—Pd) alloy.

8. The method according to claim 7,
wherein a content rate of palladium in the third conductive film is 20 atomic percent or lower.

9. The method according to claim 1,
wherein the surface layer contains the oxidative product of the metal or the metal alloy at or above a 30 nm depth from a surface of the surface layer.

10. A switch, comprising a contact device produced by the method according to claim 1, wherein in a semiconductor test apparatus, the switch connects and disconnects a test signal, or switches test signals.

11. A semiconductor test apparatus, comprising the switch according to claim 10.

12. A contact device, comprising:
a fixed contact fixed on a support layer;
an actuator that moves close to and away from the support layer; and
a moving contact supported by the actuator to be brought into and out of contact with the fixed contact along with the actuator moving close and away,
wherein the contact device becomes electrically continuous when the fixed contact and the moving contact are brought into contact, and
the fixed contact includes:
a first conductive film formed on the support layer;
a second conductive film formed on the first conductive film and containing a metal or an alloy of the metal;
a third conductive film formed on the second conductive film; and
a surface layer that is brought into contact with the moving contact, the surface layer containing an oxidative product of the metal in the second conductive film, which metal has been diffused to be precipitated out from a surface of the third conductive film and oxidized.

13. The contact device according to claim 12, wherein the moving contact includes:

a first conductive film formed on the actuator;

a second conductive film formed on the first conductive film and containing a metal or an alloy of the metal;

a third conductive film formed on the second conductive film; and a surface layer that is brought into contact with the fixed contact, the surface layer containing an oxidative product of the metal in the second conductive film, which metal has been diffused to be precipitated out from a surface of the third conductive film and oxidized.

14. The contact device according to claim 12, wherein the actuator includes a piezoelectric material layer that expands or contracts when a voltage is applied thereto.

15. The contact device according to claim 12, wherein the actuator includes: a heater that generates heat when energized by a current; and a bimorph including a member that expands when heated by the heater.

* * * * *